(12) United States Patent
Shirakawa et al.

(10) Patent No.: US 12,375,054 B2
(45) Date of Patent: Jul. 29, 2025

(54) ACOUSTIC WAVE FILTER WITH BURIED CONNECTION LAYER UNDER RESONATOR

(71) Applicant: Skyworks Global Pte. Ltd., Singapore (SG)

(72) Inventors: Alexandre Augusto Shirakawa, Cardiff by the Sea, CA (US); Kwang Jae Shin, Yongin (KR); Yiliu Wang, Irvine, CA (US); Taecheol Shon, Gyeonggi-do (KR)

(73) Assignee: Skyworks Global Pte. Ltd., Singapore (SG)

( * ) Notice: Subject to any disclaimer, the term of this patent is extended or adjusted under 35 U.S.C. 154(b) by 562 days.

(21) Appl. No.: 17/655,866

(22) Filed: Mar. 22, 2022

(65) Prior Publication Data
US 2022/0321102 A1    Oct. 6, 2022

Related U.S. Application Data

(60) Provisional application No. 63/200,862, filed on Mar. 31, 2021, provisional application No. 63/200,860, filed on Mar. 31, 2021.

(51) Int. Cl.
| | |
|---|---|
| *H03H 3/02* | (2006.01) |
| *H03H 9/05* | (2006.01) |
| *H03H 9/17* | (2006.01) |
| *H03H 9/54* | (2006.01) |
| *H03H 9/56* | (2006.01) |

(52) U.S. Cl.
CPC ............ *H03H 3/02* (2013.01); *H03H 9/0504* (2013.01); *H03H 9/17* (2013.01); *H03H 9/54* (2013.01); *H03H 9/568* (2013.01)

(58) Field of Classification Search
CPC .......... H03H 3/02; H03H 9/0504; H03H 9/17; H03H 9/54; H03H 9/568; H03H 3/08; H03H 9/02574
See application file for complete search history.

(56) References Cited

U.S. PATENT DOCUMENTS

| | | | | |
|---|---|---|---|---|
| 6,713,314 | B2 * | 3/2004 | Wong | H03H 9/105 |
| | | | | 438/455 |
| 7,161,283 | B1 | 1/2007 | Geefay | |
| 7,250,831 | B2 * | 7/2007 | Song | H03H 9/706 |
| | | | | 29/25.35 |
| 7,863,699 | B2 * | 1/2011 | Dropmann | H01L 25/16 |
| | | | | 333/191 |
| 8,749,320 | B2 * | 6/2014 | Nishihara | H03H 9/588 |
| | | | | 333/187 |
| 8,922,302 | B2 * | 12/2014 | Ruby | H03H 9/172 |
| | | | | 29/25.35 |

(Continued)

*Primary Examiner* — Jeffrey T Carley
*Assistant Examiner* — Jose K Abraham
(74) *Attorney, Agent, or Firm* — Knobbe, Martens, Olson & Bear LLP

(57) ABSTRACT

A packaged acoustic wave component has a device substrate and a metal layer disposed over the device substrate. An acoustic wave device is disposed over at least a portion of the metal layer so that the metal layer is interposed between the device substrate and at least a portion of the acoustic wave device. A cap substrate is spaced above the device substrate, and peripheral wall that is attached to and extends between the device substrate and the cap substrate, the peripheral wall surrounding the acoustic wave device. One or more vias extend through the device substrate and are disposed under the metal layer.

15 Claims, 20 Drawing Sheets

(56) References Cited

U.S. PATENT DOCUMENTS

| | | | |
|---|---|---|---|
| 9,444,426 B2* | 9/2016 | Burak | H03H 9/173 |
| 9,450,167 B2 | 9/2016 | Zou et al. | |
| 9,793,877 B2* | 10/2017 | Martin | H03H 9/17 |
| 10,873,311 B2 | 12/2020 | Ando et al. | |
| 2005/0140468 A1* | 6/2005 | Wang | H03H 9/564 |
| | | | 333/191 |
| 2006/0012021 A1 | 1/2006 | Larson, III et al. | |
| 2006/0249824 A1* | 11/2006 | Lee | H03H 9/1078 |
| | | | 257/678 |
| 2006/0267710 A1* | 11/2006 | Matsumoto | H03H 9/175 |
| | | | 333/191 |
| 2007/0080757 A1* | 4/2007 | Yahata | H03H 9/706 |
| | | | 333/133 |
| 2007/0085632 A1 | 4/2007 | Larson, III et al. | |
| 2008/0169884 A1* | 7/2008 | Matsumoto | H03H 9/583 |
| | | | 333/187 |
| 2009/0134957 A1* | 5/2009 | Shin | H03H 9/105 |
| | | | 333/187 |
| 2011/0156836 A1* | 6/2011 | Lee | H03H 9/0566 |
| | | | 333/133 |
| 2013/0313947 A1 | 11/2013 | Chen et al. | |
| 2016/0315244 A1* | 10/2016 | Khurshidjon | H03H 3/02 |
| 2016/0365843 A1* | 12/2016 | Martin | H03H 9/17 |
| 2018/0068915 A1* | 3/2018 | Kang | H03H 9/02007 |
| 2019/0149123 A1* | 5/2019 | Sakashita | H03H 9/173 |
| | | | 333/195 |
| 2019/0379349 A1* | 12/2019 | Lee | H03H 9/105 |
| 2020/0021265 A1* | 1/2020 | Lee | H03H 9/173 |
| 2020/0083861 A1* | 3/2020 | Matsuo | H03H 9/0211 |
| 2020/0099365 A1* | 3/2020 | Choy | H03H 9/1014 |
| 2020/0321940 A1* | 10/2020 | Cheon | H03H 9/566 |
| 2020/0373899 A1* | 11/2020 | Lee | H03H 9/13 |
| 2021/0099157 A1 | 4/2021 | Takano et al. | |
| 2022/0321080 A1 | 10/2022 | Shirakawa et al. | |

* cited by examiner

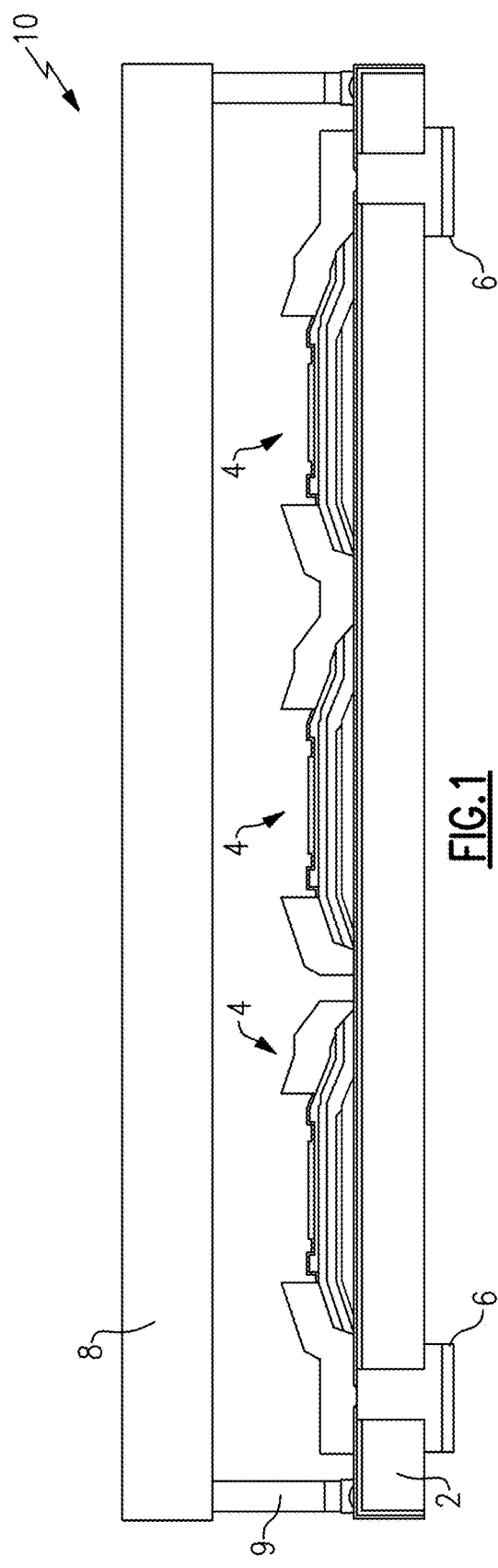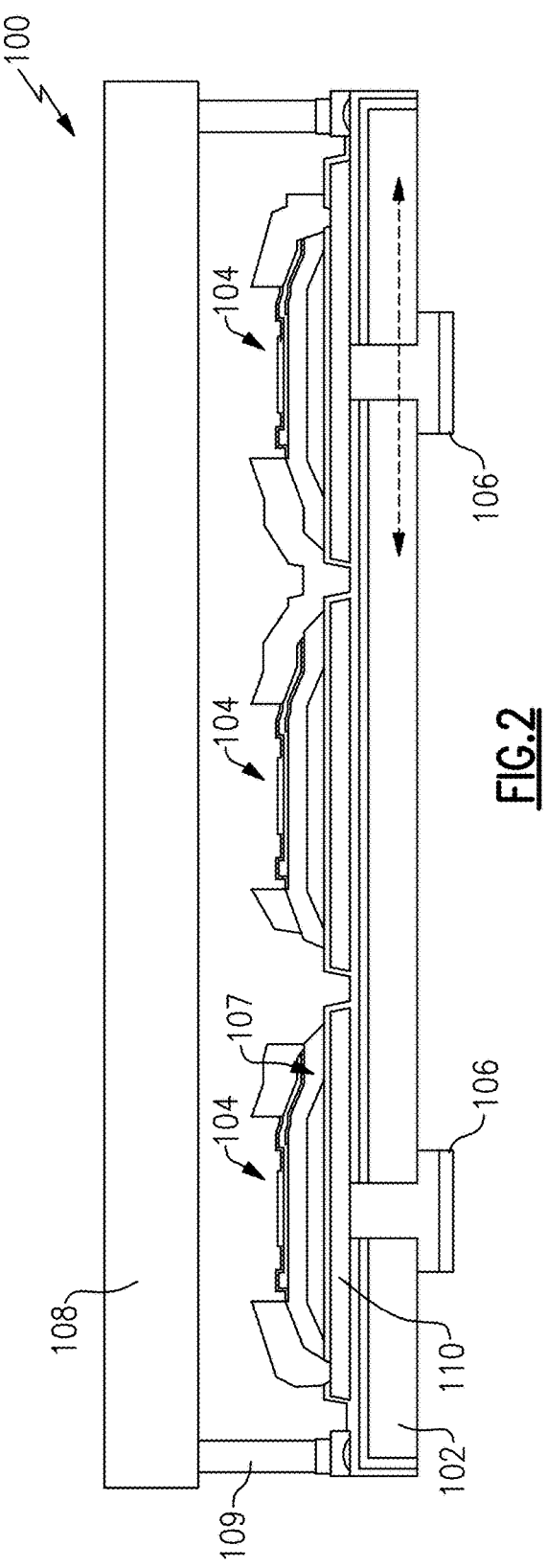

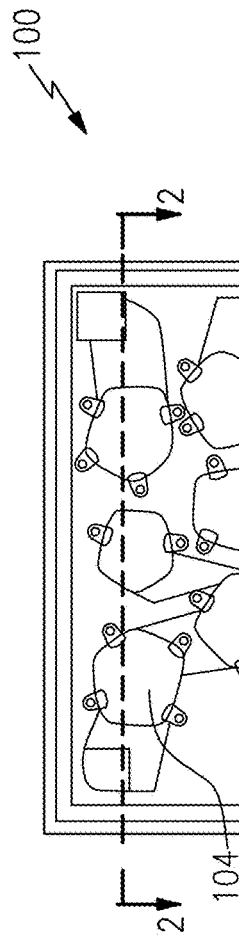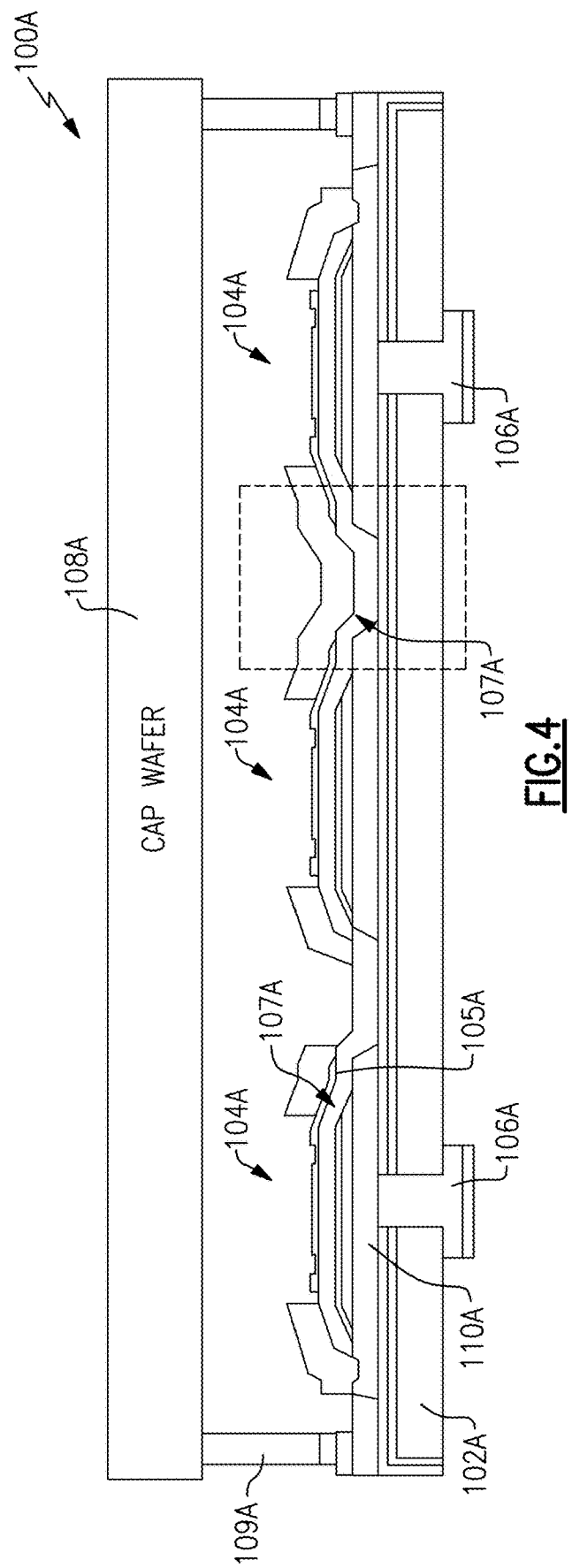

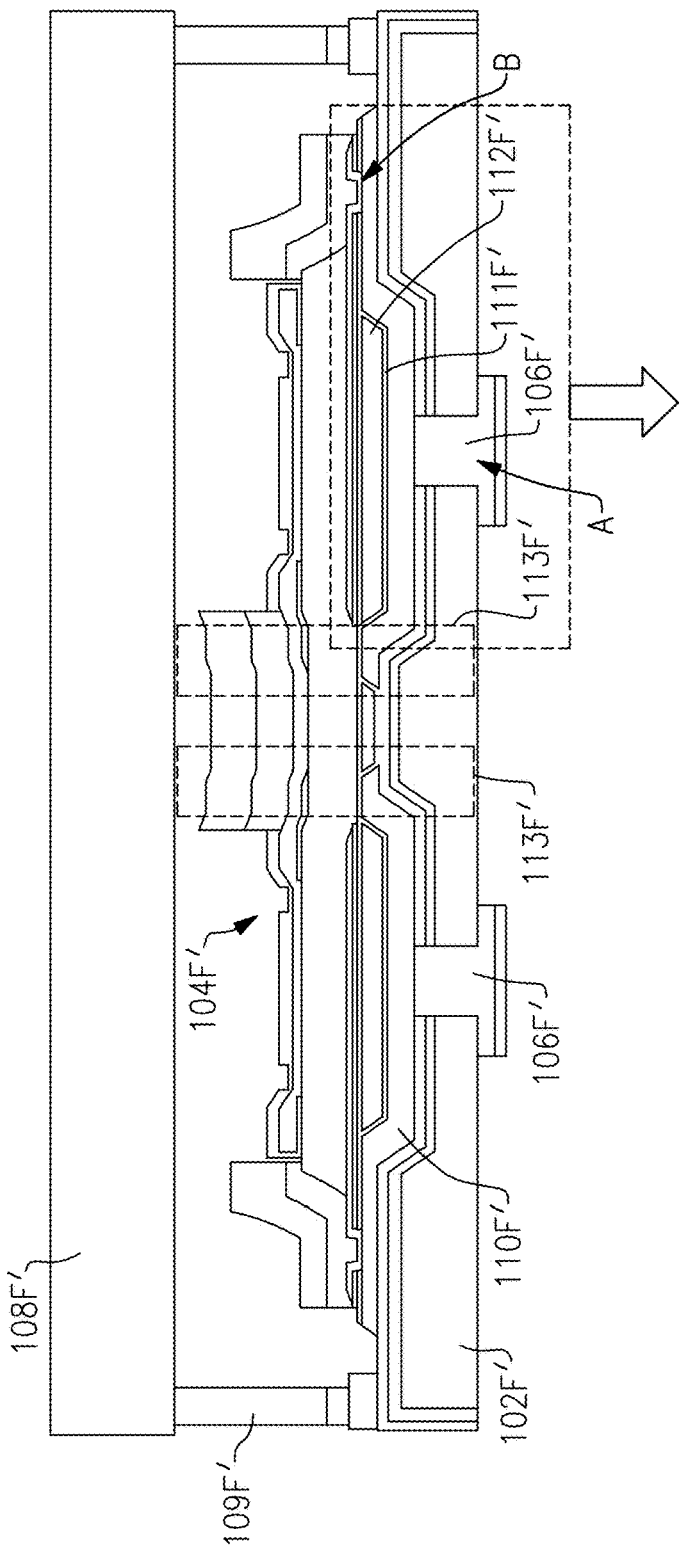
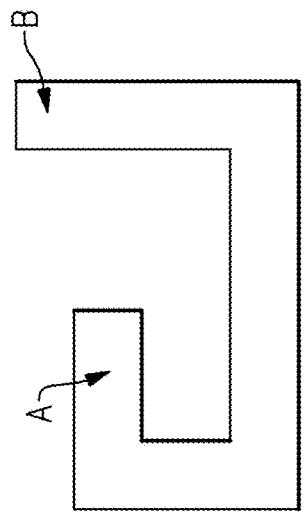
FIG.13A
FIG.13B

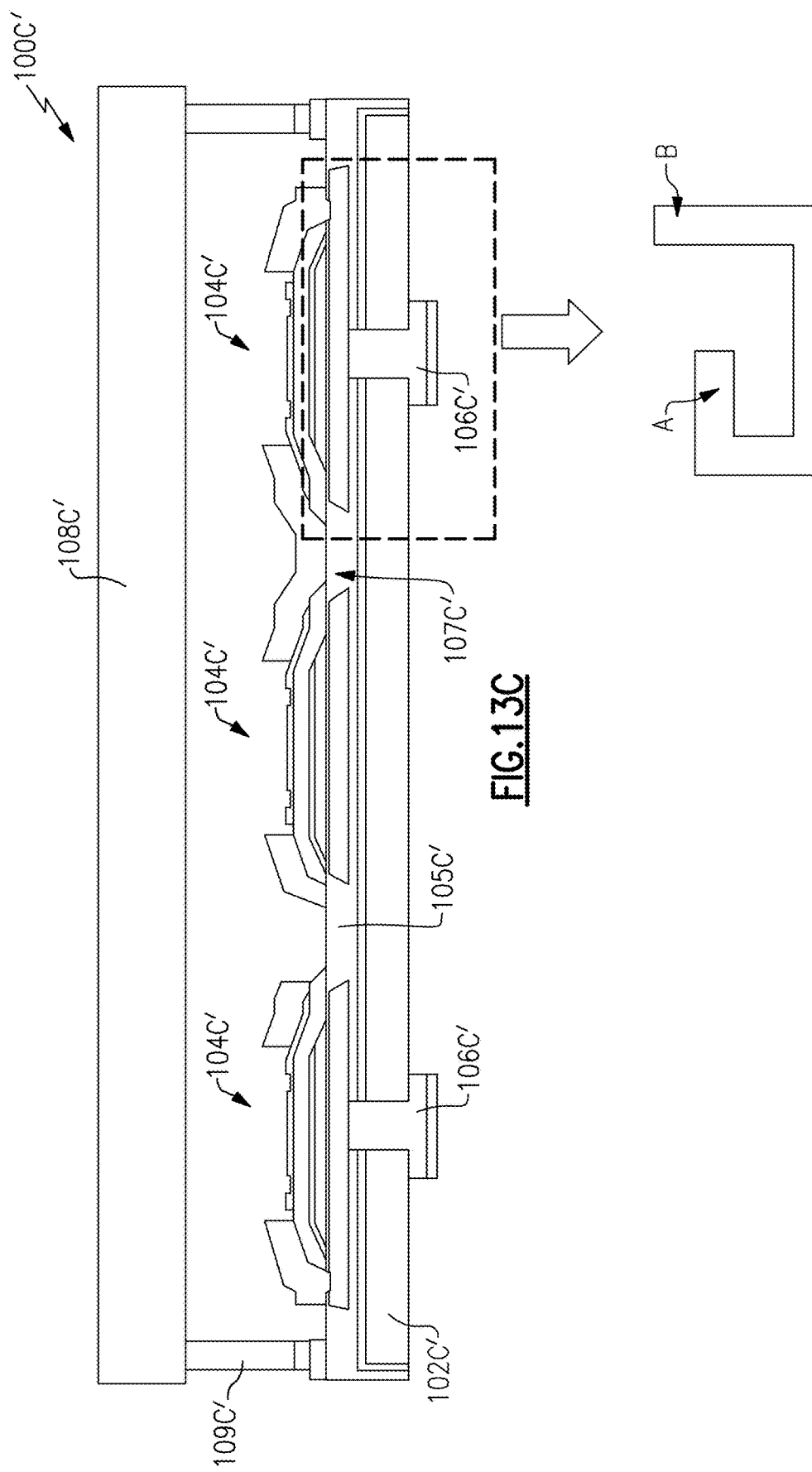

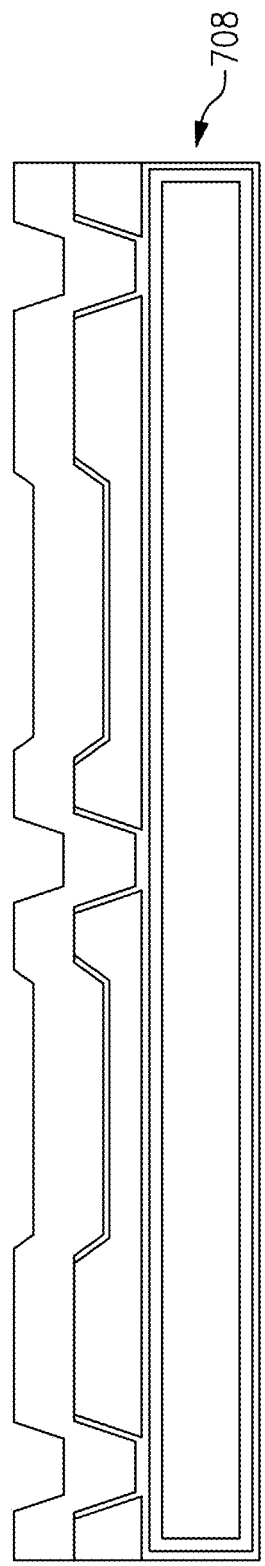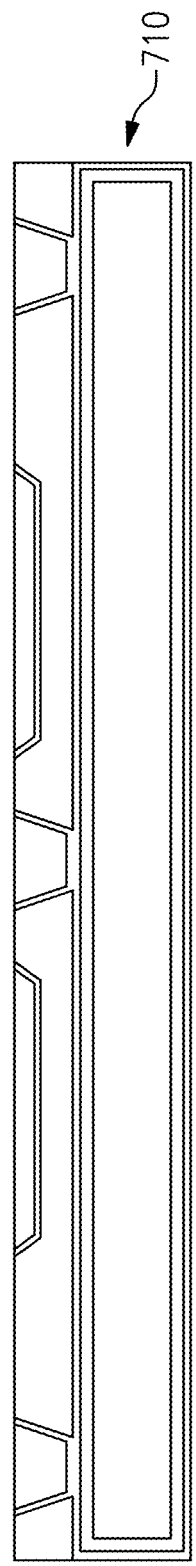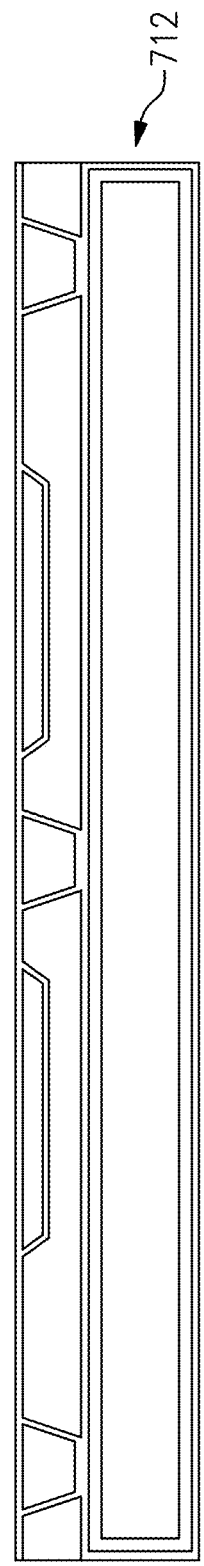

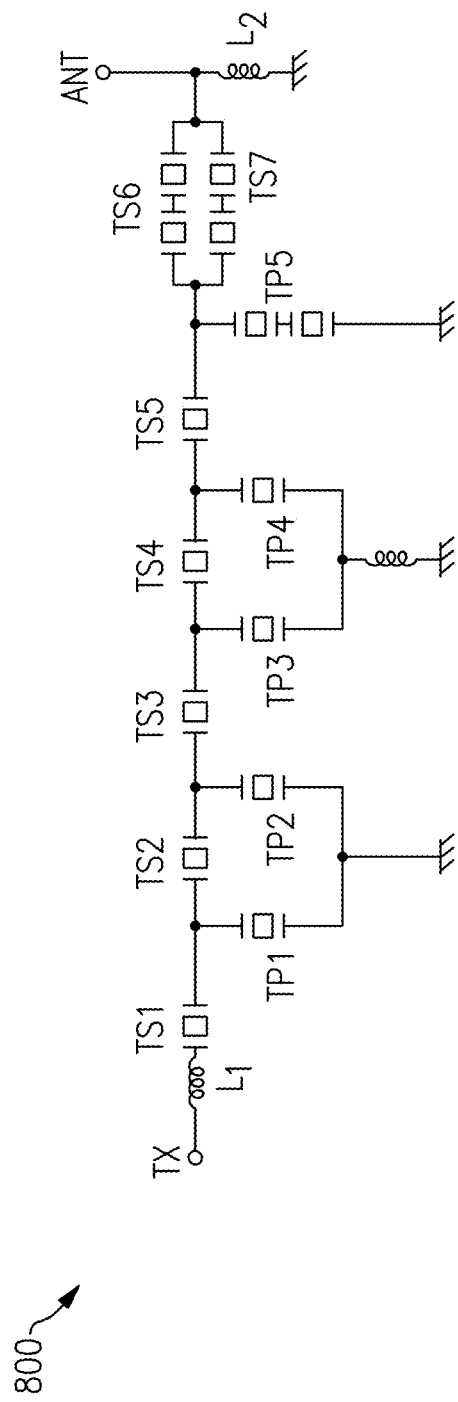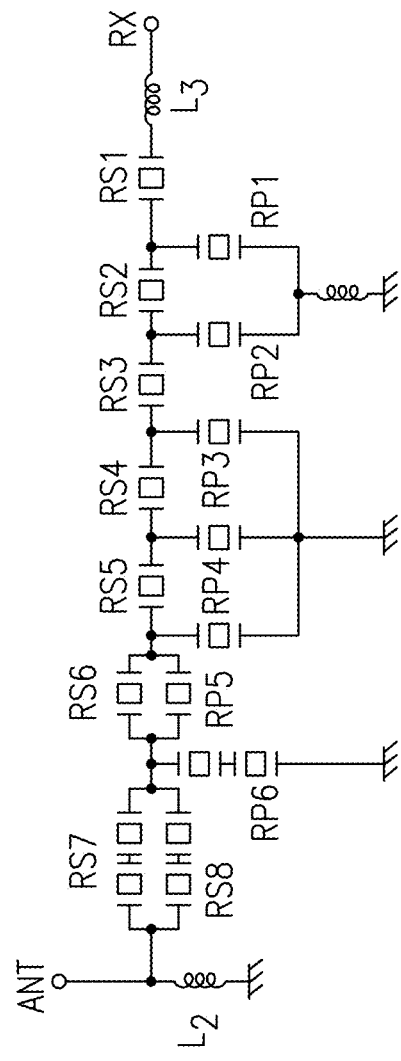
FIG.20A
FIG.20B

ACOUSTIC WAVE FILTER WITH BURIED CONNECTION LAYER UNDER RESONATOR

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include bulk acoustic wave (BAW) filters. However, such acoustic wave filters operate at a high frequency range, making size reduction of packages including BAW filters difficult.

SUMMARY

In accordance with one aspect of the disclosure, a bulk acoustic wave (BAW) device package is provided with a buried connection metal layer underneath a resonator that advantageously allows for a reduction in the size of the package.

In accordance with one aspect of the disclosure, a packaged acoustic wave device component is provided. The packaged acoustic wave component comprises a device substrate and a metal layer disposed over the device substrate. An acoustic wave device is disposed over at least a portion of the metal layer so that at least a portion of the metal layer is interposed between the device substrate and the acoustic wave device.

In accordance with another aspect of the disclosure, a radio frequency module is provided. The radio frequency module comprises a package substrate and a packaged acoustic wave component including a device substrate and a metal layer disposed over the device substrate. An acoustic wave device is disposed over at least a portion of the metal layer so that at least a portion of the metal layer is interposed between the device substrate and the acoustic wave device.

In accordance with another aspect of the disclosure, a wireless communication device is provided. The wireless communication device comprises an antenna and a front end module including one or more packaged acoustic wave components configured to filter a radio frequency signal associated with the antenna. Each packaged acoustic wave component includes a device substrate and a metal layer disposed over the device substrate. An acoustic wave device is disposed over at least a portion of the metal layer so that at least a portion of the metal layer is interposed between the device substrate and the acoustic wave device.

In accordance with another aspect of the disclosure, a method of manufacturing a packaged acoustic wave component is provided. The method comprises forming or providing a device substrate, forming a metal layer over the device substrate, and forming or providing an acoustic wave device and mounting the acoustic wave device over at least a portion of the metal layer. The method further comprises forming or providing a cap substrate, and forming or providing a peripheral wall and attaching one end of the peripheral wall to the device substrate so that the peripheral wall surrounds the acoustic wave device. The method also comprises attaching the cap substrate to an opposite end of the peripheral wall. In one example, the method further includes forming one or more vias so that the one or more vias extend through the device substrate and are disposed under the metal layer.

In accordance with another aspect of the disclosure, a method of manufacturing a packaged acoustic wave component is provided. The method comprises forming or providing a device substrate, forming a metal layer over the device substrate, and forming or providing a bulk acoustic wave resonator and mounting the bulk acoustic wave resonator over at least a portion of the metal layer. In one example, the method further includes forming one or more vias so that the one or more vias extend through the device substrate and are disposed under the metal layer.

BRIEF DESCRIPTION OF THE DRAWINGS

Embodiments of this disclosure will now be described, by way of non-limiting example, with reference to the accompanying drawings.

FIG. 1 illustrates a schematic cross-sectional side view of a conventional bulk acoustic wave device structure.

FIG. 2 illustrates a schematic cross-sectional side view of a bulk acoustic wave device structure taking along line 2-2 in FIG. 3.

FIG. 3 illustrates a schematic top view of a bulk acoustic wave device structure.

FIG. 4 illustrates a schematic cross-sectional side view of a bulk acoustic wave device structure.

FIG. 13A illustrates a schematic cross-sectional side view of a bulk acoustic wave device structure.

FIG. 13B illustrates a top view of a portion of the bulk acoustic wave device structure of FIG. 13A.

FIG. 13C illustrates a schematic cross-sectional side view of a bulk acoustic wave device structure.

FIG. 13D illustrates a top view of a portion of the bulk acoustic wave device structure of FIG. 13C.

FIGS. 19A-19F show steps in a process for manufacturing the bulk acoustic wave device structure of FIG. 12.

FIG. 20A is a schematic diagram of a transmit filter that includes an acoustic wave resonator according to an embodiment.

FIG. 20B is a schematic diagram of a receive filter that includes an acoustic wave resonator according to an embodiment.

DETAILED DESCRIPTION

Figure 5:
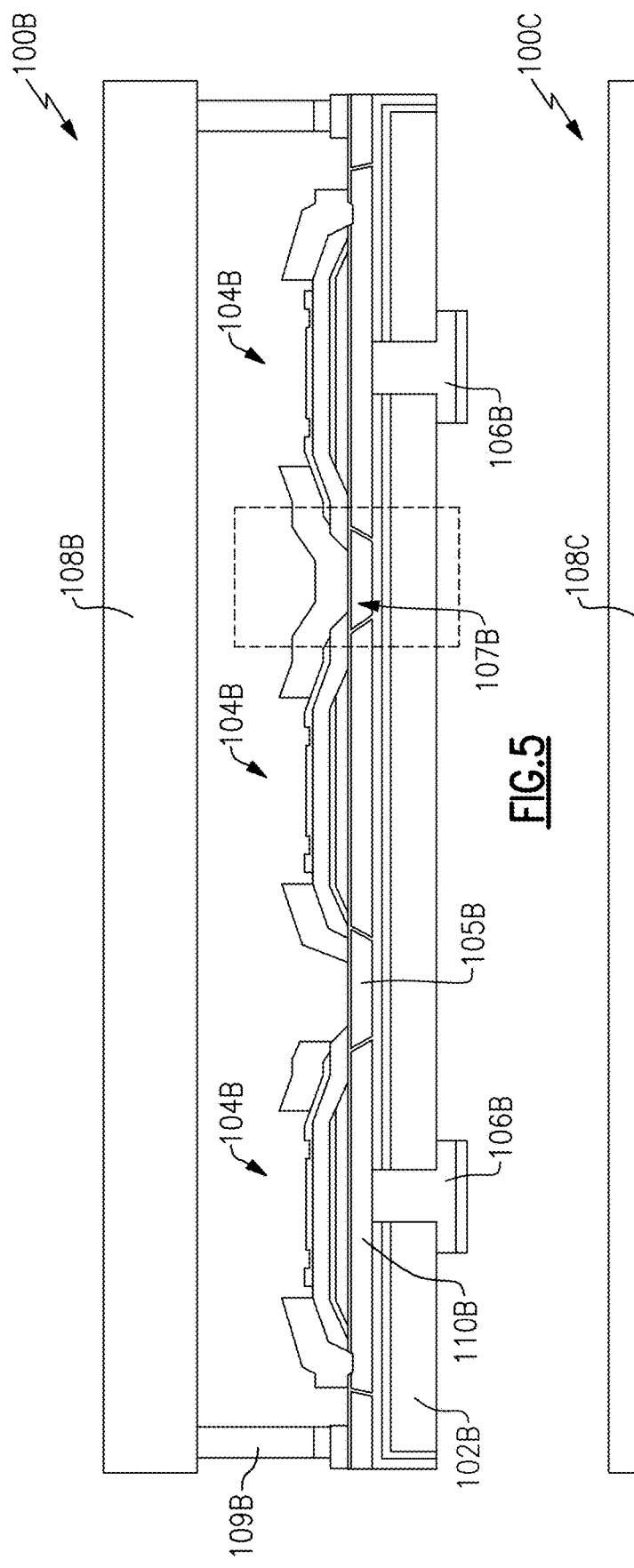
FIG. 5 illustrates a schematic cross-sectional side view of a bulk acoustic wave device structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with bulk acoustic wave (BAW) devices.

FIG. 1 illustrates a conventional bulk acoustic wave (BAW) package or component 10 with bulk acoustic wave (BAW) resonators or devices 4 disposed on (e.g., mounted to) a device substrate 2. The BAW resonators 4 can be electrically connected to terminals 6 (e.g., on an opposite surface of the device substrate 2 from the BAW resonators 4) by vias (e.g., through-silicon vias or TSVs). The terminals 4 can be land grid array (LGA) terminals. The BAW package or component 10 includes a cap substrate 8 disposed over and space from the device substrate 10. A peripheral wall 9 extends between and attaches the cap substrate 8 to the device substrate 2 and encloses (e.g., surrounds) the BAW resonators 4. The device substrate 2 and the cap substrate 8 can be made of silicon.

FIGS. 2-3 show an improved bulk acoustic wave (BAW) package or component 100. The BAW package or component 100 has a device substrate 102, a cap substrate 108 and a peripheral wall 109 that extends between the device substrate 102 and the cap substrate 108. One or more metal layers 110 are disposed on the device substrate 102. The one or more metal layers 110 can be buried underneath (e.g., disposed under) one or more BAW resonators or devices 104 (e.g., so that substantially all of, such as entirely all of, the BAW resonator 104 is above the metal layer(s) 110). The BAW resonator 104 can have a bottom electrode and a top electrode separated by a piezoelectric material. The BAW resonator 104 can have a cavity (e.g., air filled cavity) between the bottom electrode and the metal layer(s) 110. The BAW resonators 104 can be electrically connected to terminals 106 (e.g., on an opposite surface of the device substrate 102 from the BAW resonators 104) by vias (e.g., through-silicon vias or TSVs) that connect with the metal layer(s) 110. The terminals 106 can be land grid array (LGA) terminals. The metal layer(s) 110 can be linear (e.g., planar, extend along a plane). The metal layer(s) 110 can have one or more cutouts or slots that allow one or more BAW resonator(s) 104 to be connected to input/output connections and one or more BAW resonator(s) 104 to not be connected to input/output connections. The metal layer(s) 110 can be made of a low resistance material, such as one or more of aluminum (Al), copper (Cu), silver (Ag) and gold (Au) and/or high melting material such as one or more of molybdenum (Mo), ruthenium (Ru), platinum (Pt), tungsten (W) and chromium (Cr).

Advantageously, the metal layer(s) 110 allow a reduction of the in die size (e.g., overall transverse width of BAW package 100 as compared with width of BAW package 10 in FIGS. 1-2), for example, by approximately 15%-20%. For example, the metal layer(s) 110 allow a reduction in the size of the die or BAW package 100 by allowing a reduction of the connection pad size of for the resonator(s) 104 and allowing the location of the terminals 106 (and vias connected to the terminals 106) underneath the resonator(s) 104. The input/output connections to the BAW resonators 104 in the BAW package 100 advantageously do not take space on the die or BAW package 100; rather, they can, for example, be placed under the BAW resonators 104 or in areas that do not conflict with the spacing and separation of the BAW resonators 104. Further, the metal layer(s) 110 can advantageously enhance (e.g., improve, facilitate) thermal dissipation of heat from the BAW resonator(s) 104. For example, the metal layer(s) 110 reduce the thermal path for extracting heat from the BAW resonator(s) 104, because the heat can flow directly from the BAW resonator(s) 104 to the vias (connected to the terminals 106) by way of the metal layer(s) 110 and then to an exterior of the BAW package 100. The input/output connections to the BAW resonators 104 can also be ideally placed to have optimum thermal path to ground conditions for dissipating heat. Additionally, the metal layer(s) 110 can advantageously provide a larger ground plane (e.g., by increasing an amount of the ground plane dimension, such as the peripheral common ground area in FIG. 3 that extends around the BAW resonators 104) and improve out of band rejection.

FIG. 4 schematically illustrates a BAW package or component 100A. Some of the features of the BAW package or component 100A are similar to features of the BAW package or component 100 in FIGS. 2-3. Thus, reference numerals used to designate the various components of the BAW package or component 100A are identical to those used for identifying the corresponding components of the BAW package or component 100 in FIGS. 2-3, except that an "A" has been added to the numerical identifier. Therefore, the structure and description for the various features of the BAW package 100 in FIGS. 2-3 are understood to also apply to the corresponding features of the BAW package 100A in FIG. 4, except as described below.

The BAW package or component 100A differs from the BAW package or component 100 in that the step height 105A is smaller because of a thinner piezoelectric layer 107A is disposed over the buried metal layer(s) 110A and mesa cavity (as compared with the piezoelectric layer 107 for the BAW package or component 100). Additionally, the BAW package component 100A has an extended thick piezoelectric layer 107A, which advantageously reduces parasitic capacitance between the buried metal layer(s) 110A and top electrode/M2 of the BAW resonator(s) 104A.

FIG. 5 schematically illustrates a BAW package or component 100B. Some of the features of the BAW package or component 100B are similar to features of the BAW package or component 100 in FIGS. 2-3. Thus, reference numerals used to designate the various components of the BAW package or component 100B are identical to those used for identifying the corresponding components of the BAW package or component 100 in FIGS. 2-3, except that a "B" has been added to the numerical identifier. Therefore, the structure and description for the various features of the BAW package 100 in FIGS. 2-3 are understood to also apply to the corresponding features of the BAW package 100B in FIG. 5, except as described below.

The BAW package or component 100B differs from the BAW package or component 100 in that it includes a filled sacrificial layer 105B, 107B that reduces step height and reduces (e.g., minimizes) parasitic capacitance between the buried metal layer(s) 110B and top electrode/M2 of the BAW resonator(s) 104B.

Figure 6:
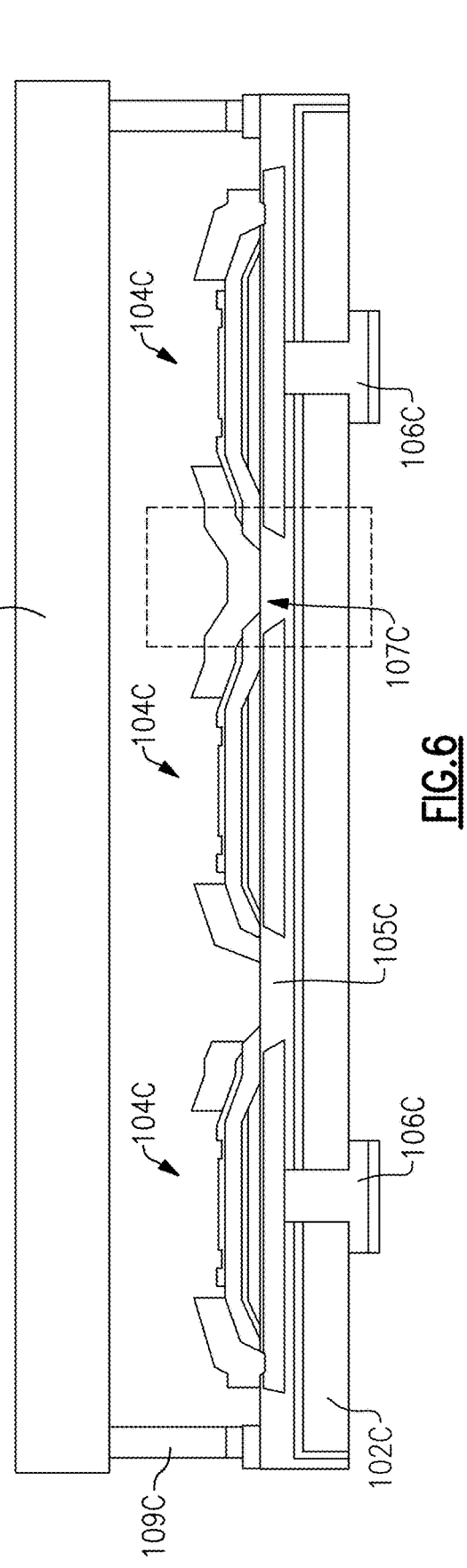
FIG. 6 illustrates a schematic cross-sectional side view of a bulk acoustic wave device structure.

FIG. 6 schematically illustrates a BAW package or component 100C. Some of the features of the BAW package or component 100C are similar to features of the BAW package or component 100 in FIGS. 2-3. Thus, reference numerals used to designate the various components of the BAW package or component 100C are identical to those used for identifying the corresponding components of the BAW package or component 100 in FIGS. 2-3, except that a "C" has been added to the numerical identifier. Therefore, the structure and description for the various features of the BAW package 100 in FIGS. 2-3 are understood to also apply to the corresponding features of the BAW package 100C in FIG. 6, except as described below.

The BAW package or component 100C differs from the BAW package or component 100 in that it includes a filled piezoelectric layer 105C, 107C that reduces step height and reduces (e.g., minimizes) parasitic capacitance between the buried metal layer(s) 110C and top electrode/M2 of the BAW resonator(s) 104C. In one implementation, the filled layer can instead include a dielectric material, e.g. can be a filled dielectric layer. The filled dielectric layer can be made of Silicon dioxide (SiO2), Silicon Nitride (SiN) or other suitable dielectric materials.

Figure 7:
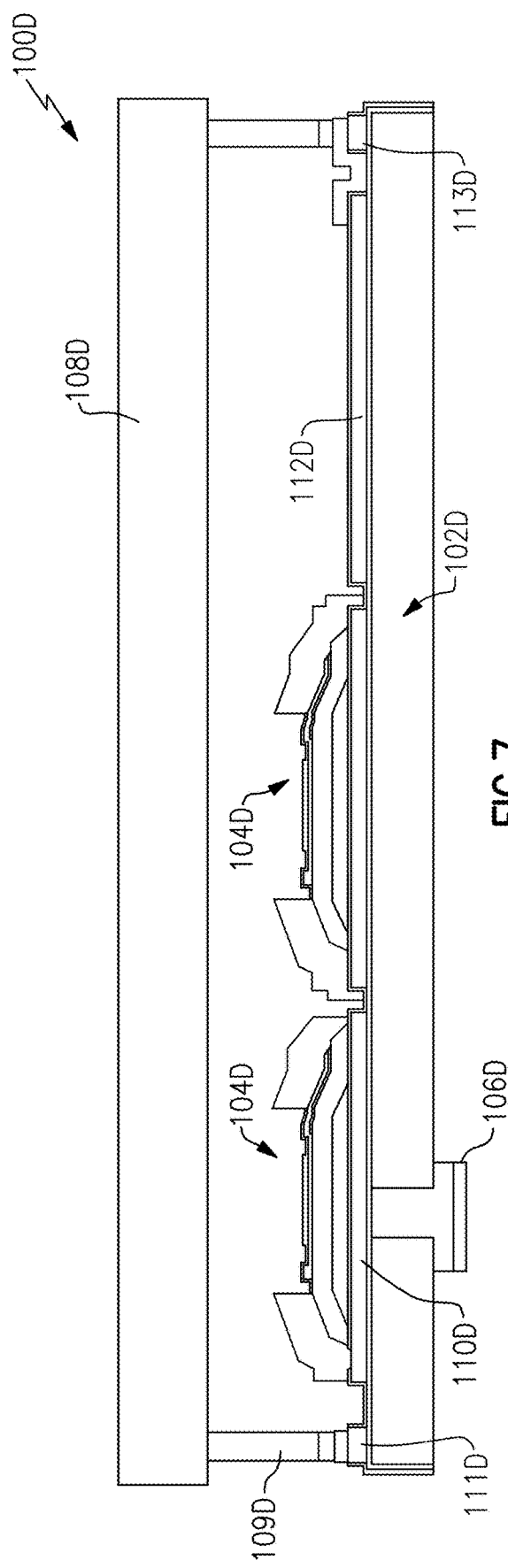
FIG. 7 illustrates a schematic cross-sectional side view of a bulk acoustic wave device structure.
Figure 8:
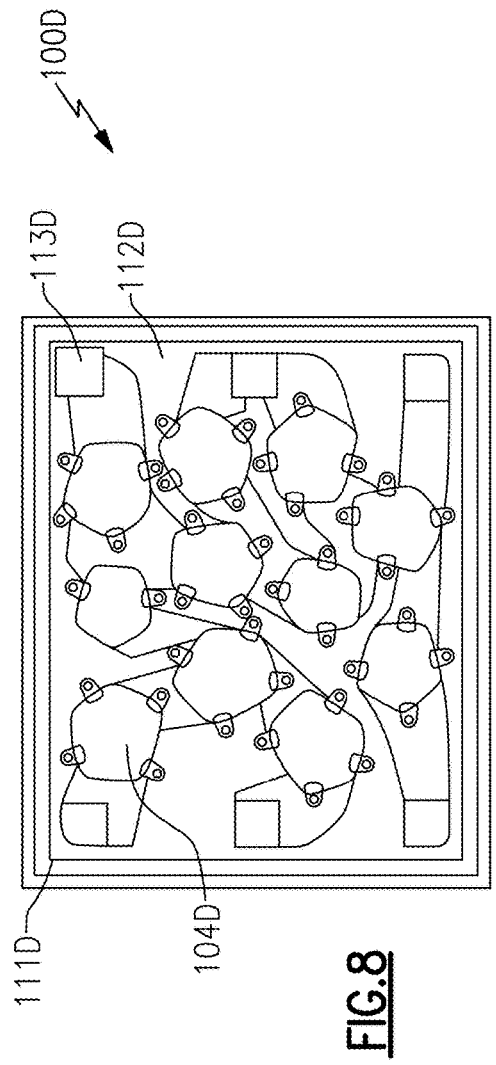
FIG. 8 illustrates a schematic top view of a bulk acoustic wave device structure.

FIGS. 7-8 schematically illustrates a BAW package or component 100D. Some of the features of the BAW package or component 100D are similar to features of the BAW package or component 100 in FIGS. 2-3. Thus, reference numerals used to designate the various components of the BAW package or component 100D are identical to those used for identifying the corresponding components of the BAW package or component 100 in FIGS. 2-3, except that a "D" has been added to the numerical identifier. Therefore, the structure and description for the various features of the BAW package 100 in FIGS. 2-3 are understood to also apply to the corresponding features of the BAW package 100D in FIGS. 7-8, except as described below.

The BAW package or component 100D differs from the BAW package or component 100 in that it includes a buried metal layer 111D, 113D between the device substrate 102D and the peripheral wall 109D (e.g., on the ground seal ring), which advantageously reduces electrical resistance and increases a ground area of the BAW package 100D. Additionally, the BAW package 100D includes a metal layer 112D under an open area (e.g., not under a BAW resonator 104D), which advantageously increases a ground area of the BAW package 100D. In one implementation, the metal layer 112D can have a linear (e.g., planar) solid form. In another implementation, the metal layer 112D can be a redistribution layer that provides an inductor (e.g., have a curved form as shown in FIG. 13B).

Figure 9:
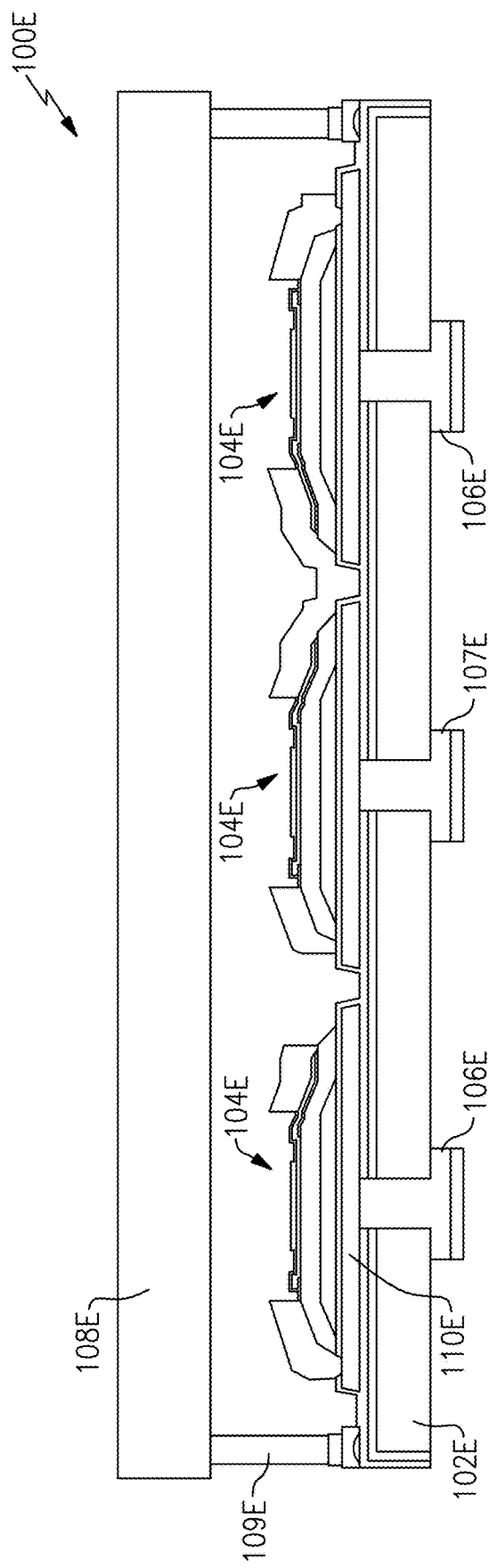
FIG. 9 illustrates a schematic cross-sectional side view of a bulk acoustic wave device structure.
Figure 10:
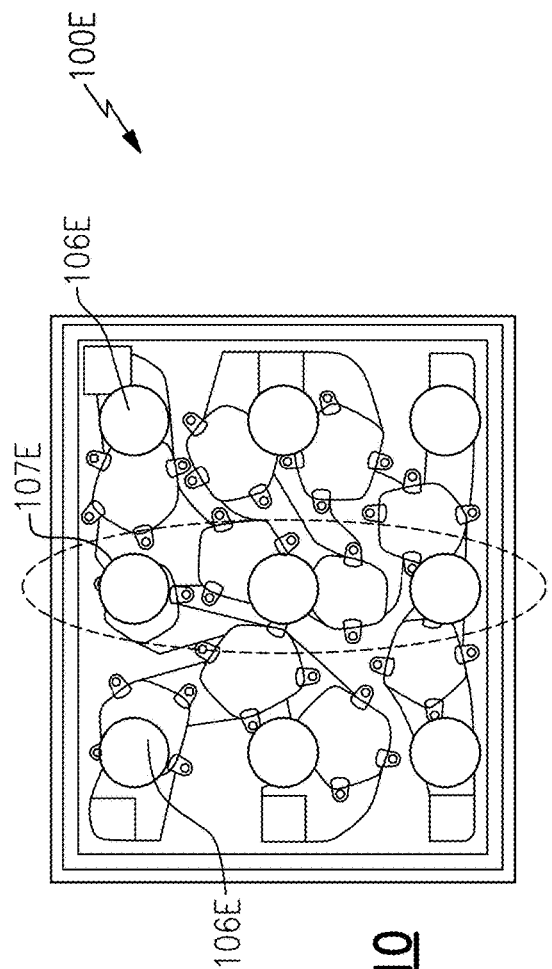
FIG. 10 illustrates a schematic top view of a bulk acoustic wave device structure.

FIGS. 9-10 schematically illustrates a BAW package or component 100E. Some of the features of the BAW package or component 100E are similar to features of the BAW package or component 100 in FIGS. 2-3. Thus, reference numerals used to designate the various components of the BAW package or component 100E are identical to those used for identifying the corresponding components of the BAW package or component 100 in FIGS. 2-3, except that an "E" has been added to the numerical identifier. Therefore, the structure and description for the various features of the BAW package 100 in FIGS. 2-3 are understood to also apply to the corresponding features of the BAW package 100E in FIGS. 9-10, except as described below.

The BAW package or component 100E differs from the BAW package or component 100 in that it includes one or more additional vias 107E through the device substrate 102E and in contact with the metal layer(s) 110E. The vias 107E facilitate (e.g. improve) thermal dissipation from the BAW resonators 104E. The vias 107E reduce the thermal path for extracting heat from the BAW resonator(s) 104, because the heat can flow directly from the BAW resonator(s) 104 to the vias 107E by way of the metal layer(s) 110E and then to an exterior of the BAW package 100E.

Figure 11:
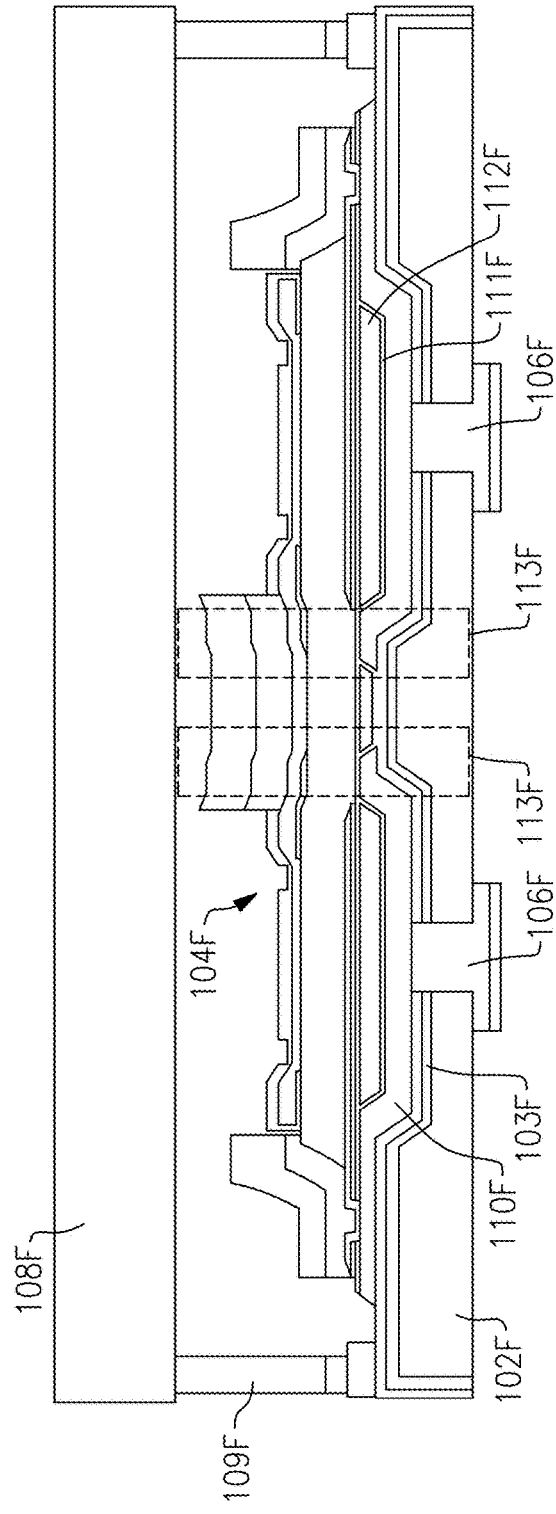
FIG. 11 illustrates a schematic cross-sectional side view of a bulk acoustic wave device structure.

FIG. 11 schematically illustrates a BAW package or component 100F. Some of the features of the BAW package or component 100F are similar to features of the BAW package or component 100 in FIGS. 2-3. Thus, reference numerals used to designate the various components of the BAW package or component 100F are identical to those used for identifying the corresponding components of the BAW package or component 100 in FIGS. 2-3, except that an "F" has been added to the numerical identifier. Therefore, the structure and description for the various features of the BAW package 100 in FIGS. 2-3 are understood to also apply to the corresponding features of the BAW package 100F in FIG. 11, except as described below.

The BAW package or component 100F has a device substrate 102F, a cap substrate 108F and a peripheral wall 109F that extends between the device substrate 102F and the cap substrate 108F. One or more metal layers 110F are disposed on the device substrate 102F. The one or more metal layers 110F can be buried underneath (e.g., disposed under) one or more BAW resonators or devices 104F. The BAW resonators 104F can be electrically connected to terminals 106F by vias (e.g., through-silicon vias or TSVs) that connect with the metal layer(s) 110F. The terminals 106F can be land grid array (LGA) terminals. The device substrate 102F can have one or more (e.g., a pair of) recessed portions 103F (e.g., etched into the substrate) and the metal layer(s) 110F have offset portions 111F that extend into the recessed portions 103F adjacent to (e.g., next to, in contact with) a surface of the device substrate 102F. The BAW resonator 104F is disposed over the metal layer(s) 110F and has a linear bottom structure so that cavities 112F are defined between the BAW resonator 104F and the offset portions 111F of the metal layer(s) 110F. The cavities 112F can be air filled. The topology of the BAW resonator 104F is reduced so that the connection with the metal layer(s) 110F is substantially flat and reduces (e.g., minimizes) ohmic loss. Additionally the topology of the BAW resonator 104F is generally more flat (e.g., relative to the BAW resonators 104), providing advantages in manufacturing (e.g., due to the simpler structure). The BAW resonator 104F also has a suspended bridge 113F that can advantageously reduce (e.g., minimize) parasitic capacitance between the buried metal layer(s) 110F and top electrode/M2 of the BAW resonator(s) 104F.

Figure 12:
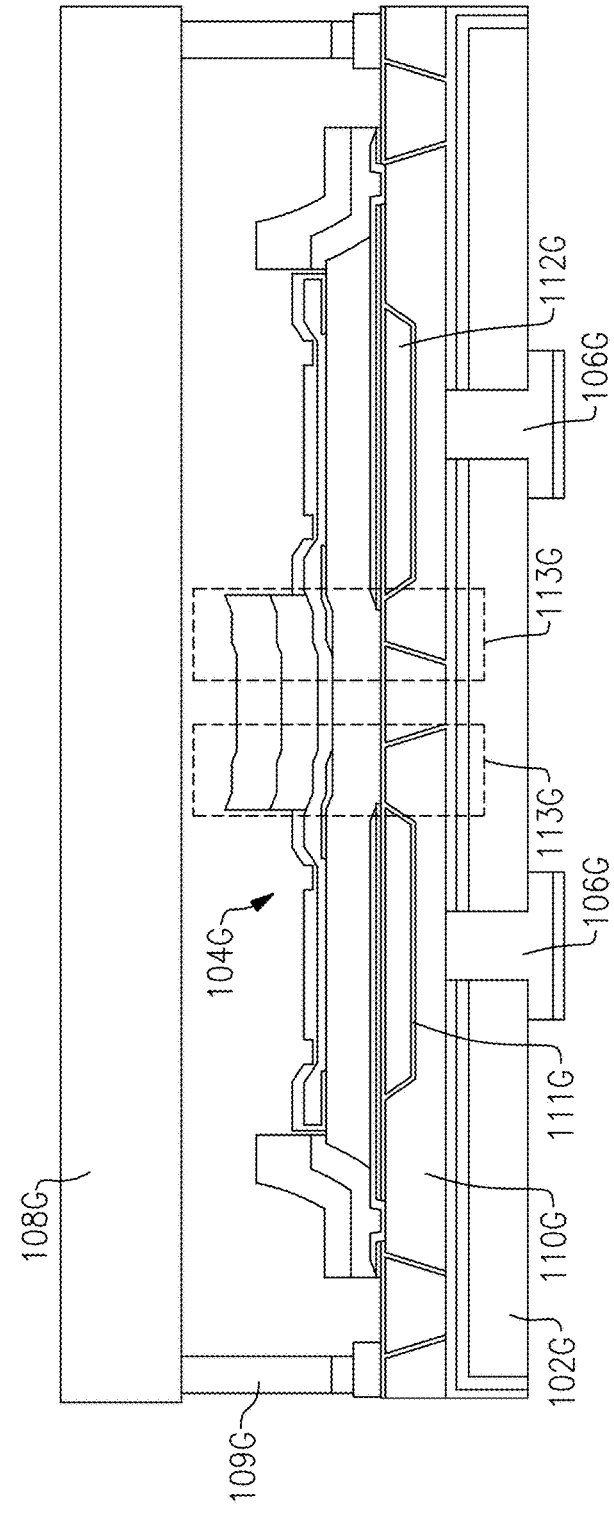
FIG. 12 illustrates a schematic cross-sectional side view of a bulk acoustic wave device structure.

FIG. 12 schematically illustrates a BAW package or component 100G. Some of the features of the BAW package or component 100G are similar to features of the BAW package or component 100F in FIG. 11. Thus, reference numerals used to designate the various components of the BAW package or component 100G are identical to those used for identifying the corresponding components of the BAW package or component 100F in FIG. 11, except that a "G" instead of an "F" has been added to the numerical identifier. Therefore, the structure and description for the various features of the BAW package 100F in FIG. 11 are understood to also apply to the corresponding features of the BAW package 100G in FIG. 12, except as described below.

The BAW package or component 100G differs from the BAW package or component 100F in that the device substrate 102G is planar (e.g., flat) and does not have recesses in it. Additionally, the metal layer 110G is disposed on the device substrate 102G and has recessed 111G that define cavities 112G under the BAW resonator 104G. The metal layer(s) 110G can also be disposed under the peripheral wall 109G (e.g., to increase the ground area of the BAW package 100G). The BAW resonator 104G also has a suspended bridge 113G that can advantageously reduce (e.g., minimize) parasitic capacitance between the buried metal layer(s) 110G and top electrode/M2 of the BAW resonator(s) 104G.

FIGS. 13A-13B schematically illustrates a BAW package or component 100F'. Some of the features of the BAW package or component 100F' are similar to features of the BAW package or component 100F in FIG. 11. Thus, reference numerals used to designate the various components of the BAW package or component 100F' are identical to those used for identifying the corresponding components of the BAW package or component 100F in FIG. 11, except that a "'" has been added to the numerical identifier. Therefore, the structure and description for the various features of the BAW package 100F in FIG. 11 are understood to also apply to the corresponding features of the BAW package 100F' in FIGS. 13A-13B, except as described below.

The BAW package 100F' differs from the BAW package 100F in that the buried metal layer(s) 110F' can have a curved pattern (e.g., not a solid planar shape) to provide an inductor in the BAW package 100F', where one end A of the metal layer(s) 110F' provides a connection to an external pin and another end B of the metal layer(s) 110F' provides a connection to the BAW resonator 104F'. The metal layers 110F' provide an inductance directly to the BAW resonator 104F' to enhance the performance of the resonator 104F'. The metal layer 100F' can then be a redistribution layer that can behave like an inductor.

FIGS. 13C-13D schematically illustrates a BAW package or component 100C'. Some of the features of the BAW package or component 100C' are similar to features of the BAW package or component 100C in FIG. 6. Thus, reference numerals used to designate the various components of the BAW package or component 100C' are identical to those used for identifying the corresponding components of the BAW package or component 100C in FIG. 6, except that a "'" has been added to the numerical identifier. Therefore, the structure and description for the various features of the BAW package 100C in FIG. 6 are understood to also apply to the corresponding features of the BAW package 100C' in FIGS. 13C-13D, except as described below.

The BAW package 100C' differs from the BAW package 100C in that the buried metal layer(s) 110C' can have a curved pattern (e.g., not a solid planar shape) to provide an inductor in the BAW package 100C', where one end A of the metal layer(s) 110C' provides a connection to an external pin and another end B of the metal layer(s) 110C' provides a connection to the BAW resonator 104C'. The metal layers 110C' provide an inductance directly to the BAW resonator 104C' to enhance the performance of the resonator 104C'. The metal layer 100C' can then be a redistribution layer that can behave like an inductor.

Figure 14:
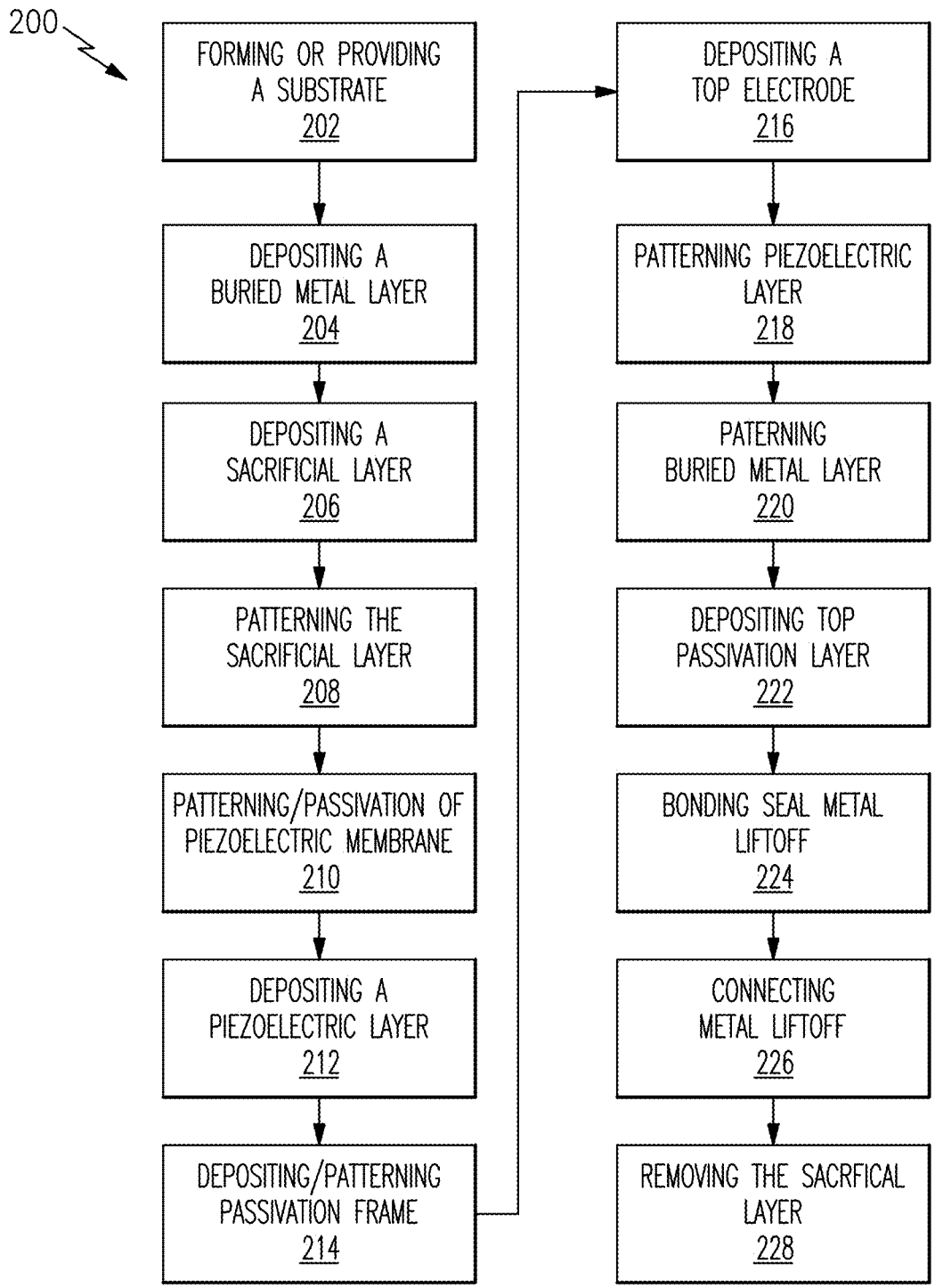
FIG. 14 shows steps in a process for manufacturing the bulk acoustic wave device structure of FIG. 2.
Figure 15A:
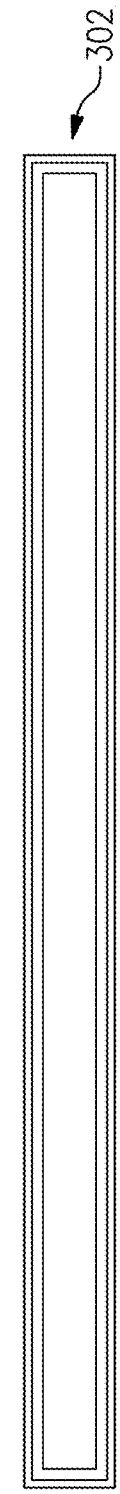
FIGS. 15A-15D show steps in a process for manufacturing the bulk acoustic wave device structure of FIG. 4.
Figure 15B:
Figure 15C:
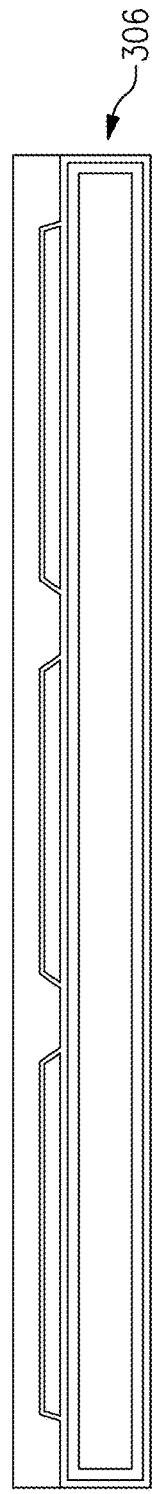
Figure 15D:
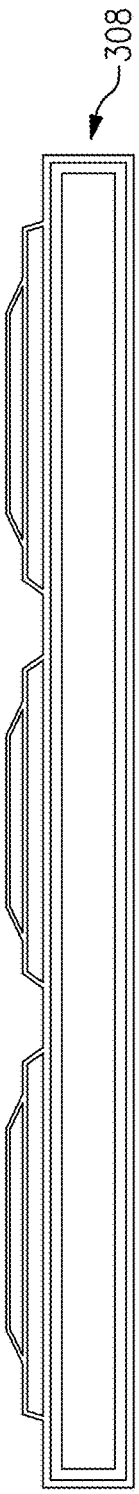
Figure 16A:
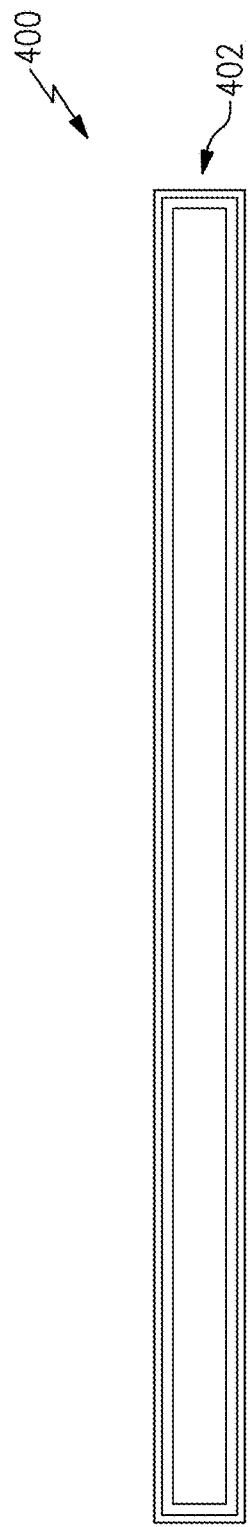
FIGS. 16A-16D show steps in a process for manufacturing the bulk acoustic wave device structure of FIG. 5.
Figure 16B:
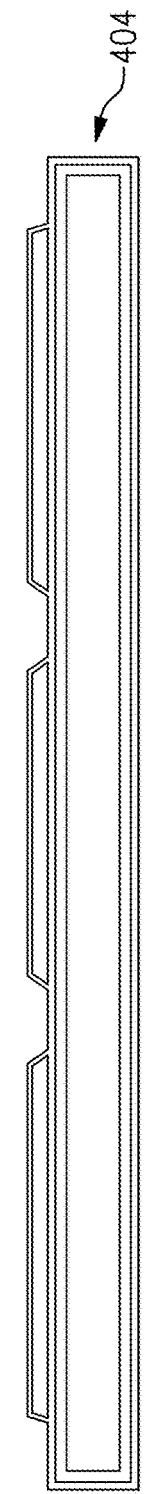
Figure 16C:
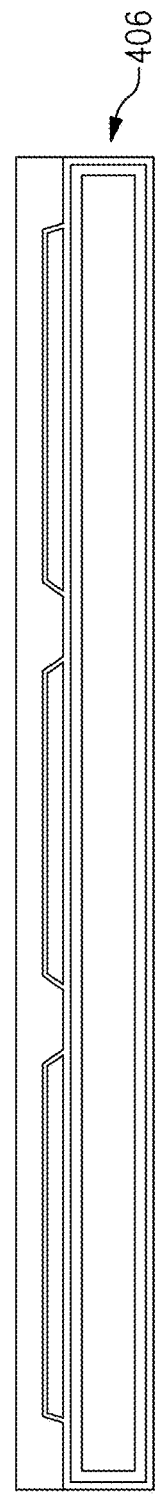
Figure 16D:
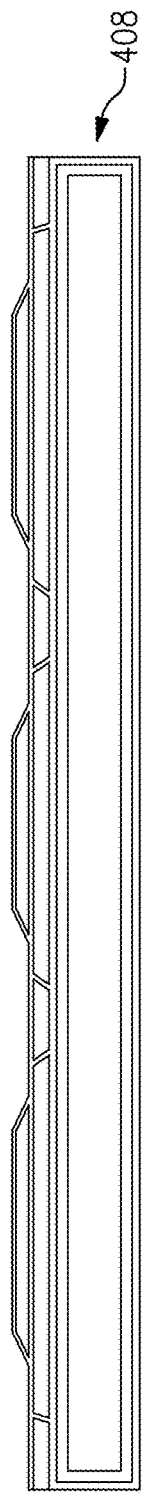
Figure 17A:
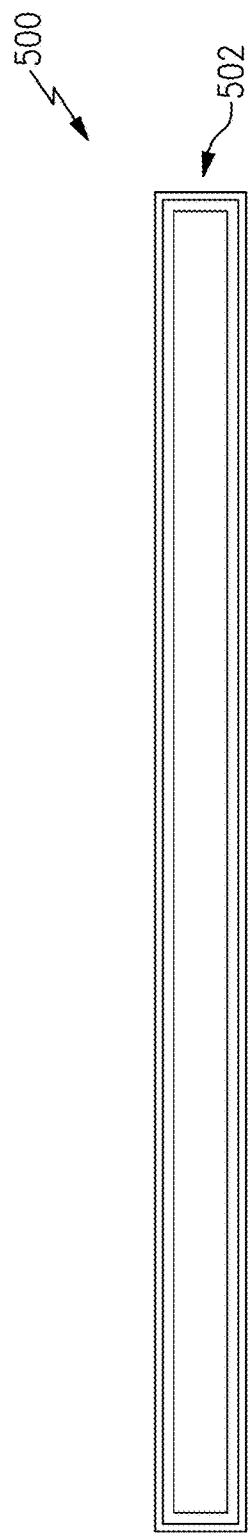
FIGS. 17A-17D show steps in a process for manufacturing the bulk acoustic wave device structure of FIG. 6.
Figure 17B:
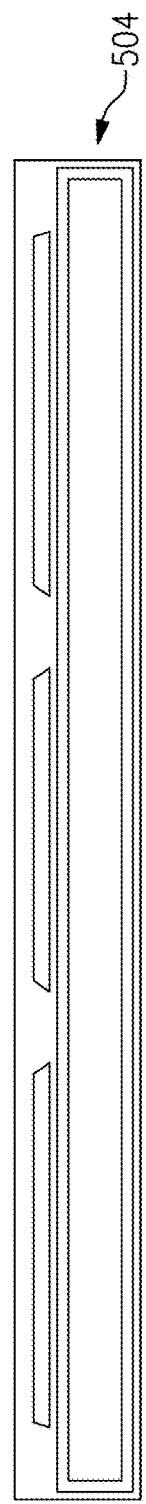
Figure 17C:
Figure 17D:
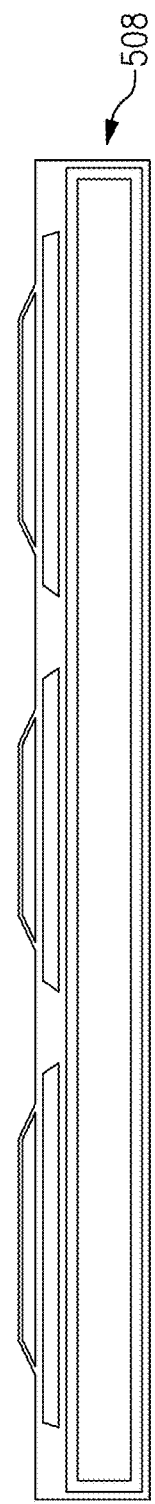

FIG. 14 shows steps (in order) of a process or method 200 for manufacturing a BAW package or component, such as the BAW package or component 100 of FIG. 2. The process 200 includes the step 202 of forming or providing a substrate, depositing a trap rich layer and a dielectric passivation layer (e.g., SiO2), followed by the step 204 of depositing a buried metal layer (e.g., by sputtering) and depositing a dielectric passivation layer (e.g., SiO2). The process 200 also includes the step 206 of depositing a sacrificial poly-silicon layer and performing a chemical mechanical planarization (CMP). The process 200 also includes the step 208 of patterning the sacrificial poly-silicon layer and depositing a dielectric passivation (e.g., SiO2) membrane, followed by the step 210 of patterning and passivation dielectric (e.g., SiO2) membrane and depositing and patterning a bottom electrode (e.g., of the end product BAW resonator). The process 200 also includes the step 212 of depositing a piezoelectric (e.g., AlN based) layer, followed by the step 214 of depositing and patterning a dielectric passivation (e.g., SiO2) frame. The process 200 additionally includes the step 216 of depositing a top electrode (e.g., of the end product BAW resonator), metal frame liftoff, and patterning of the top electrode, followed by the step 218 of patterning the piezoelectric (e.g., AlN based) layer. The process 200 further includes the step 220 of patterning the buried metal layer and passivation of the dielectric (e.g., SiO2) material, followed by the step 222 of depositing a top dielectric passivation layer (e.g., SiO2), patterning a recess frame and patterning the top dielectric passivation (e.g., SiO2) layer.

The process 200 also includes the step 224 of bonding the seal metal liftoff, followed by the step 226 of connecting the metal (e.g., bus bar) liftoff. Finally, the process 200 includes the step 228 of removing the sacrificial poly-silicon layer (e.g., between the buried metal layer and the bottom electrode of the BAW resonator). As shown in FIG. 2 (BAW resonator 104 on left), the top electrode/M2 metal is located on the piezoelectric layer, not the dielectric passivation layer (e.g., SiO2) to inhibit (e.g., reduce, minimize) parasitic capacitance. Also, as shown in FIG. 2 (BAW resonators 104 on right), parasitic capacitance exists between the buried metal layer (e.g., metal layer(s) 110) and the top electrode/M2 (e.g., of the BAW resonator 104).

FIGS. 15A-15D show steps (in order) of a process or method 300 for manufacturing a BAW package or component, such as the BAW package or component 100A of FIG. 4. The process 300 includes the step 302 of forming or providing a substrate, depositing a trap rich layer and a dielectric passivation layer (e.g., SiO2) on the substrate, followed by the step 304 of depositing and patterning a buried metal layer (e.g., by sputtering) and depositing a dielectric passivation layer (e.g., SiO2). The process 300 also includes the step 306 of depositing a sacrificial poly-silicon layer and performing a chemical mechanical planarization (CMP). The process 300 also includes the step 308 of patterning the sacrificial poly-silicon layer and depositing a dielectric passivation (e.g., SiO2) membrane. The remaining steps in the process 300 are similar (e.g., the same, identical) to the steps 210-228 in process 200.

FIGS. 16A-16D show steps (in order) of a process or method 400 for manufacturing a BAW package or component, such as the BAW package or component 100B of FIG. 5. The process 400 includes the step 402 of forming or providing a substrate, depositing a trap rich layer and a dielectric passivation layer (e.g., SiO2) on the substrate, followed by the step 404 of depositing and patterning a buried metal layer (e.g., by sputtering) and depositing a dielectric passivation layer (e.g., SiO2). The process 400 also includes the step 406 of depositing a sacrificial poly-silicon layer and performing a chemical mechanical planarization (CMP). The process 400 also includes the step 408 of patterning the sacrificial poly-silicon layer and depositing a dielectric passivation (e.g., SiO2) membrane. The remaining steps in the process 400 are similar (e.g., the same, identical) to the steps 210-228 in process 200.

FIGS. 17A-17D show steps (in order) of a process or method 500 for manufacturing a BAW package or component, such as the BAW package or component 100C of FIG. 6. The process 500 includes the step 502 of forming or providing a substrate, depositing a trap rich layer and a dielectric passivation layer (e.g., SiO2) on the substrate, followed by the step 504 of depositing and patterning a buried metal layer (e.g., by sputtering) and depositing a dielectric passivation layer (e.g., SiO2). The process 500 also includes the step 506 of performing a chemical mechanical planarization (CMP) on the deposited dielectric passivation layer (e.g., SiO2), depositing a dielectric passivation layer (e.g., SiO2), depositing a sacrificial poly-silicon layer and performing a chemical mechanical planarization (CMP) thereon. The process 500 also includes the step 508 of patterning the sacrificial poly-silicon layer and depositing a dielectric passivation (e.g., SiO2) membrane. The remaining steps in the process 500 are similar (e.g., the same, identical) to the steps 210-228 in process 200.

Figure 18:
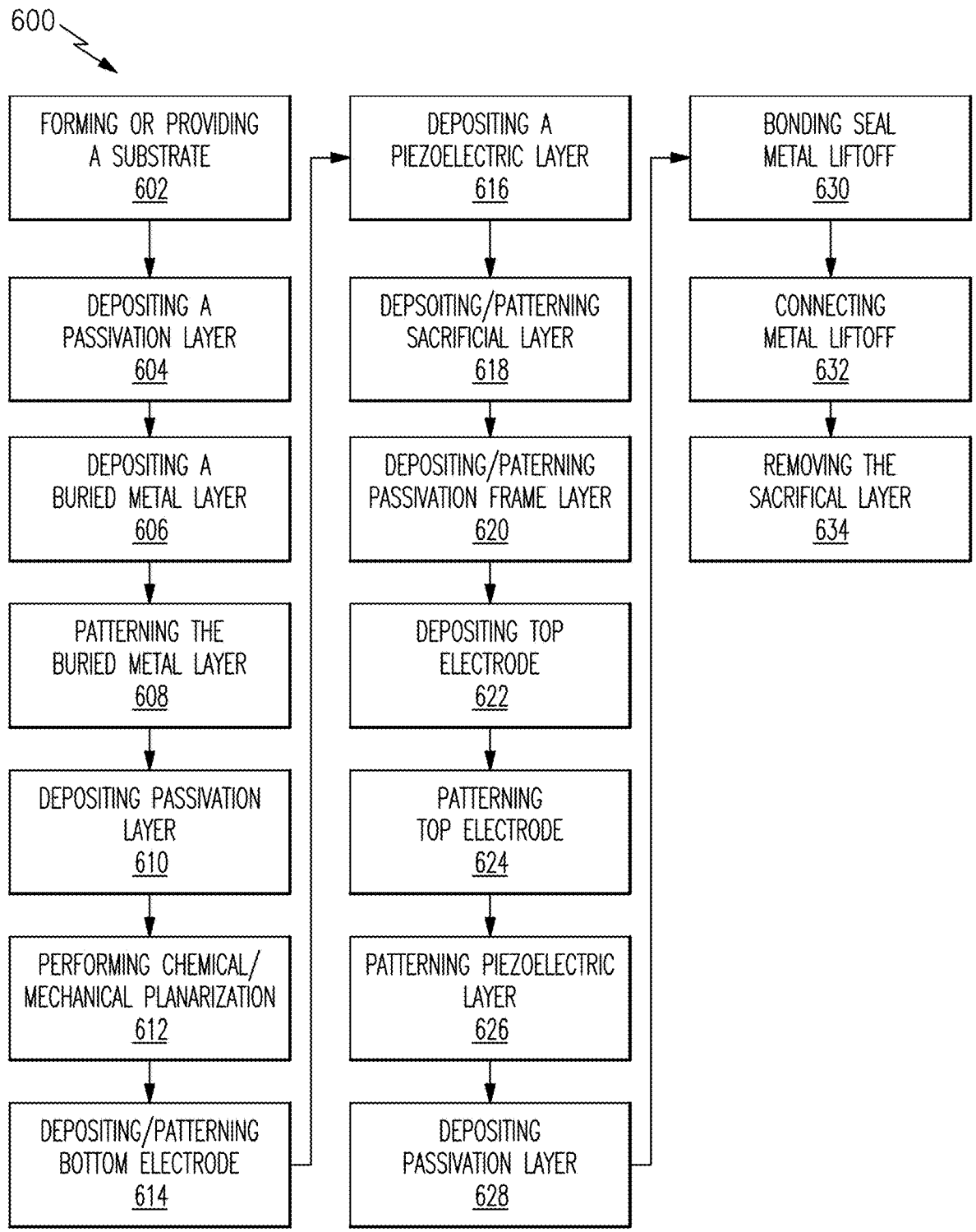
FIG. 18 shows steps in a process for manufacturing the bulk acoustic wave device structure of FIG. 11.
Figure 19A:
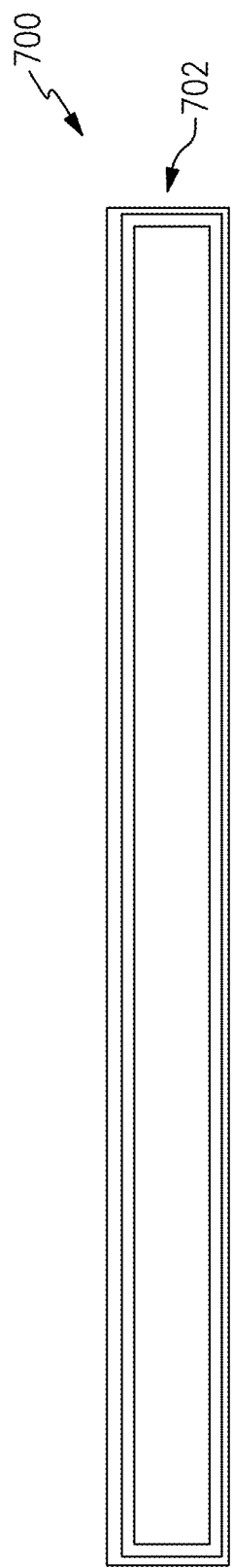
Figure 19B:
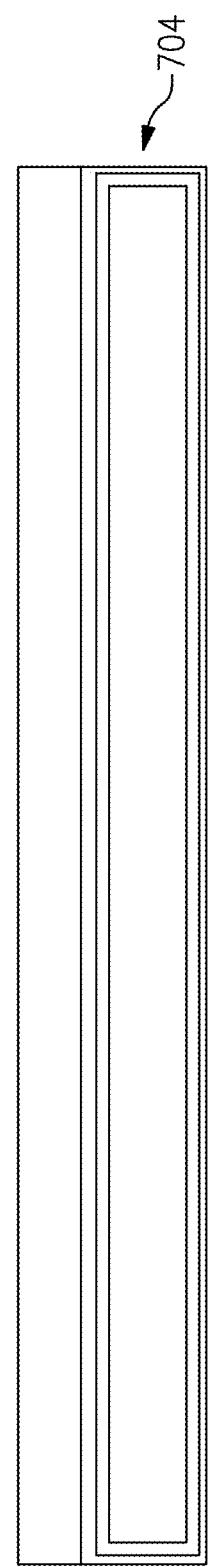
Figure 19C:
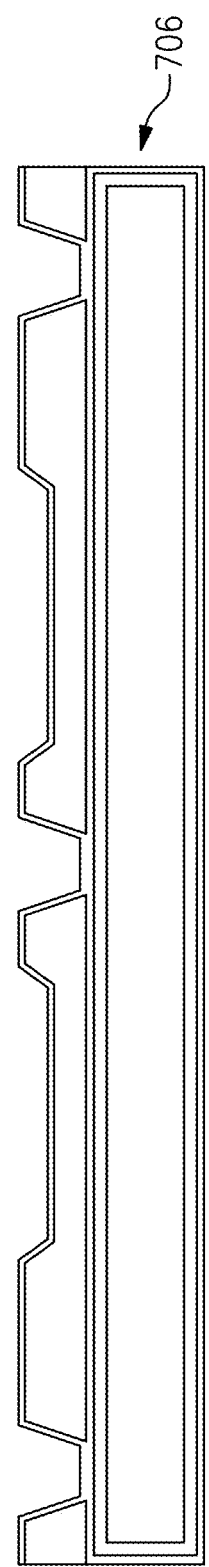

FIG. 18 shows steps (in order) of a process or method 600 for manufacturing a BAW package or component, such as the BAW package or component 100F of FIG. 11. The process 600 includes the step 602 of forming or providing a substrate and patterning the substrate (e.g., to define one or more recessed portions), and depositing a trap rich layer, followed by the step 604 of depositing a dielectric passivation layer (e.g., SiO2) and the step 606 of depositing a buried metal layer (e.g., by sputtering). The process 600 also includes the step 608 of patterning the buried metal layer, followed by the step 610 of depositing a dielectric passivation layer (e.g., SiO2) and depositing a sacrificial layer (e.g., of poly-silicon). The process 600 additionally includes the step 612 of performing a chemical mechanical planarization (CMP) on the deposited sacrificial layer and depositing a dielectric passivation (e.g., SiO2) membrane, followed by the step 614 of depositing and patterning a bottom electrode (e.g., of the end product BAW resonator 104F). The process 600 further includes the step 616 of depositing a piezoelectric layer (e.g., AlN based), followed by the step 618 of depositing and patterning a second sacrificial layer (e.g., of poly-silicon). The process 600 also includes the step 620 of depositing and patterning a dielectric passivation (e.g., SiO2) frame layer, followed by the step 622 of depositing a top electrode (e.g., of the end product BAW resonator 104F) and metal frame liftoff, which is then followed by the step 624 of patterning the top electrode. The process 600 additionally includes the step 626 of patterning the piezoelectric layer, followed by the step 628 of depositing a dielectric passivation layer (e.g., SiO2) and patterning a recess frame and dielectric passivation layer (e.g., SiO2). The process 600 further includes the step 630 of bonding the seal metal liftoff, followed by the step 632 of connecting the metal (e.g., bus bar) liftoff. Finally, the process 600 includes the step 634 of removing the sacrificial layer between the buried metal layer and the bottom of the BAW resonator (e.g., the bottom of the BAW resonator 104F).

FIGS. 19A-19F show steps (in order) of a process or method 700 for manufacturing a BAW package or component, such as the BAW package or component 100G of FIG. 12. The process 700 includes the step 702 of forming or providing a substrate, depositing a trap rich layer and a piezoelectric (e.g., SiO2) passivation layer on the substrate, followed by the step 704 of depositing a buried metal layer (e.g., by sputtering). The process 700 also includes the step 706 of patterning the buried metal layer a first time and a second time (e.g., to define recessed cavities or portions in the metal layer), followed by the step 708 of depositing and patterning a sacrificial layer (e.g., of poly-silicon). The process 700 further includes the step 710 of performing a chemical mechanical planarization (CMP) on the deposited sacrificial layer, followed by the step 712 of depositing a membrane piezoelectric (e.g., SiO2) layer. The remaining steps in the process 700 are similar (e.g., the same, identical) to the steps 614-634 in process 600.

FIG. 20A is a schematic diagram of an example transmit filter 800 that includes acoustic wave resonators according to an embodiment. The transmit filter 800 can be a band pass filter. The illustrated transmit filter 800 is arranged to filter a radio frequency signal received at a transmit port TX and provide a filtered output signal to an antenna port ANT. Some or all of the resonators TS1 to TS7 and/or TP1 to TP5 can be a BAW resonator in accordance with any suitable principles and advantages disclosed herein. For instance, one or more of the BAW resonators of the transmit filter 800 can be an acoustic wave device 104-104G of a packaged acoustic wave components 100-100G of FIGS. 2-12. Alternatively or additionally, one or more of the BAW resonators of the transmit filter 800 can be any acoustic wave resonator disclosed herein. Any suitable number of series BAW resonators and shunt BAW resonators can be included in a transmit filter 800.

FIG. 20B is a schematic diagram of a receive filter 505 that includes bulk acoustic wave resonators according to an embodiment. The receive filter 805 can be a band pass filter. The illustrated receive filter 805 is arranged to filter a radio frequency signal received at an antenna port ANT and provide a filtered output signal to a receive port RX. Some or all of the resonators RS1 to RS8 and/or RP1 to RP6 can be BAW resonators in accordance with any suitable principles and advantages disclosed herein. For instance, one or more of the BAW resonators of the receive filter 805 can be an acoustic wave device 104-104G of a packaged acoustic wave components 100-100G of FIGS. 2-12. Alternatively or additionally, one or more of the BAW resonators of the receive filter 805 can be any acoustic wave resonator disclosed herein. Any suitable number of series BAW resonators and shunt BAW resonators can be included in a receive filter 805.

Although FIGS. 20A and 20B illustrate example ladder filter topologies, any suitable filter topology can include a BAW resonator in accordance with any suitable principles and advantages disclosed herein. Example filter topologies include ladder topology, a lattice topology, a hybrid ladder and lattice topology, a multi-mode BAW filter, a multi-mode BAW filter combined with one or more other BAW resonators, and the like.

Figure 21:
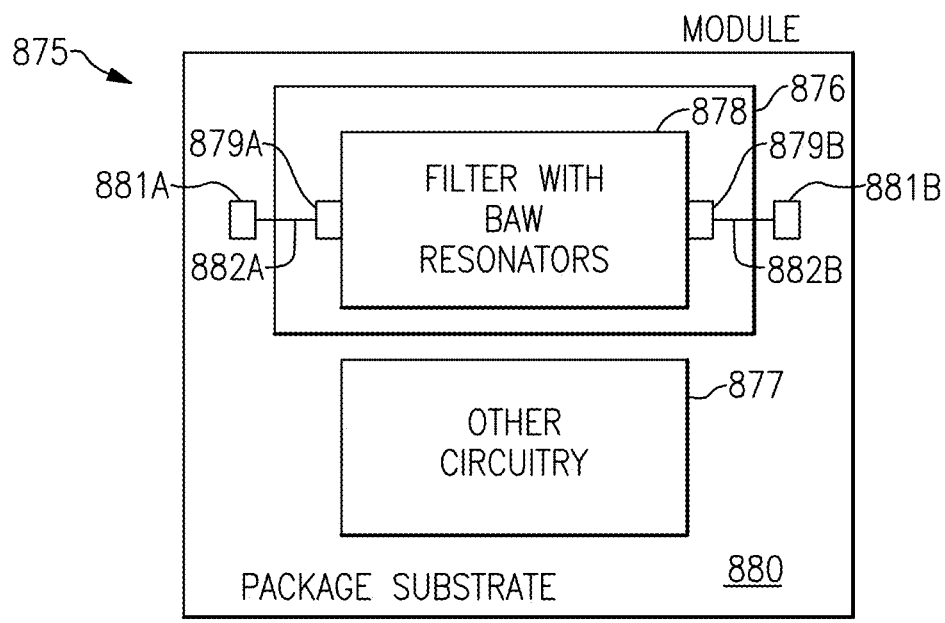
FIG. 21 is a schematic diagram of a radio frequency module that includes a bulk acoustic wave resonator according to an embodiment.

FIG. 21 is a schematic diagram of a radio frequency module 875 that includes an acoustic wave component 876 according to an embodiment. The illustrated radio frequency module 875 includes the BAW component 876 and other circuitry 877. The BAW component 876 can include one or more BAW resonators with any suitable combination of features of the BAW resonators disclosed herein. The BAW component 876 can include a BAW die that includes BAW resonators.

The BAW component 876 shown in FIG. 21 includes a filter 878 and terminals 879A and 879B. The filter 878 includes BAW resonators. One or more of the BAW resonators can be implemented in accordance with any suitable principles and advantages of the acoustic wave devices 104-104G of the packaged acoustic wave components 100-100G of FIGS. 2-12 and/or any acoustic wave resonator disclosed herein. The terminals 879A and 878B can serve, for example, as an input contact and an output contact. The BAW component 876 and the other circuitry 877 are on a common packaging substrate 880 in FIG. 21. The package substrate 880 can be a laminate substrate. The terminals 879A and 879B can be electrically connected to contacts 881A and 881B, respectively, on the packaging substrate 880 by way of electrical connectors 882A and 882B, respectively. The electrical connectors 882A and 882B can be bumps or wire bonds, for example. The other circuitry 877 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 875 can include one or more packaging structures to, for example, provide protection and/or facilitate easier handling of the radio frequency module 875. Such a packaging structure can include an overmold structure formed over the packaging substrate 880. The overmold structure can encapsulate some or all of the components of the radio frequency module 875.

Figure 22:
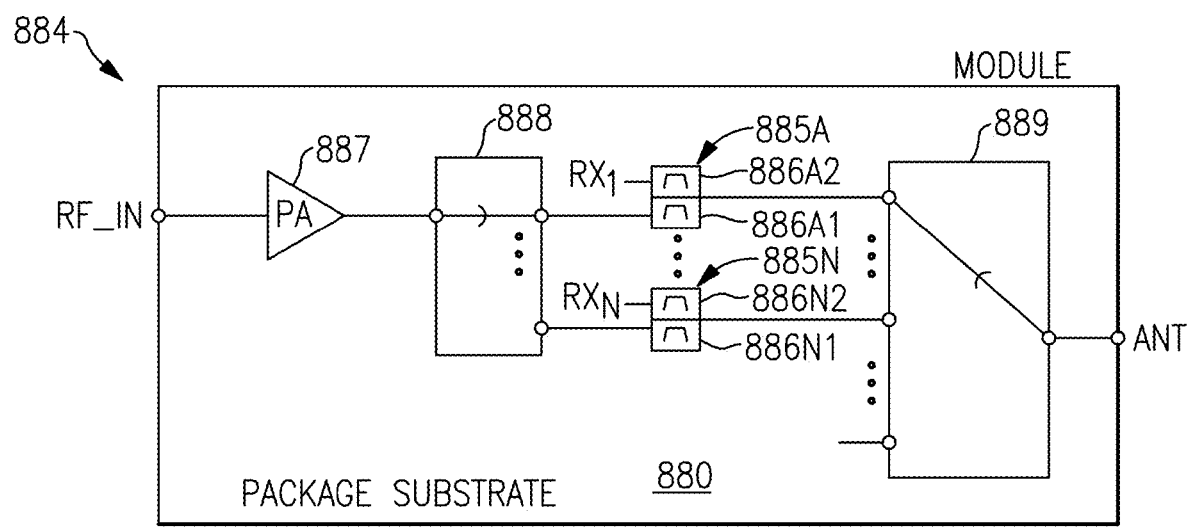
FIG. 22 is a schematic diagram of a radio frequency module that includes filters with acoustic wave resonators according to an embodiment.

FIG. 22 is a schematic diagram of a radio frequency module 884 that includes a bulk acoustic wave resonator according to an embodiment. As illustrated, the radio frequency module 884 includes duplexers 885A to 885N that include respective transmit filters 886A1 to 886N1 and respective receive filters 886A2 to 886N2, a power amplifier 887, a select switch 888, and an antenna switch 889. In some instances, the module 884 can include one or more low noise amplifiers configured to receive a signal from one or more receive filters of the receive filters 886A2 to 886N2. The radio frequency module 884 can include a package that encloses the illustrated elements. The illustrated elements can be disposed on a common packaging substrate 880. The packaging substrate can be a laminate substrate, for example.

The duplexers 885A to 885N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 886A1 to 886N1 can include one or more BAW resonators in accordance with any suitable principles and advantages disclosed herein. Similarly, one or more of the receive filters 886A2 to 886N2 can include one or more BAW resonators in accordance with any suitable principles and advantages disclosed herein. Although FIG. 22 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 887 can amplify a radio frequency signal. The illustrated switch 888 is a multi-throw radio frequency switch. The switch 888 can electrically couple an output of the power amplifier 887 to a selected transmit filter of the transmit filters 886A1 to 886N1. In some instances, the switch 888 can electrically connect the output of the power amplifier 887 to more than one of the transmit filters 886A1 to 886N1. The antenna switch 889 can selectively couple a signal from one or more of the duplexers 885A to 885N to an antenna port ANT. The duplexers 885A to 885N can be associated with different frequency bands and/or different modes of operation (e.g., different power modes, different signaling modes, etc.).

Figure 23:
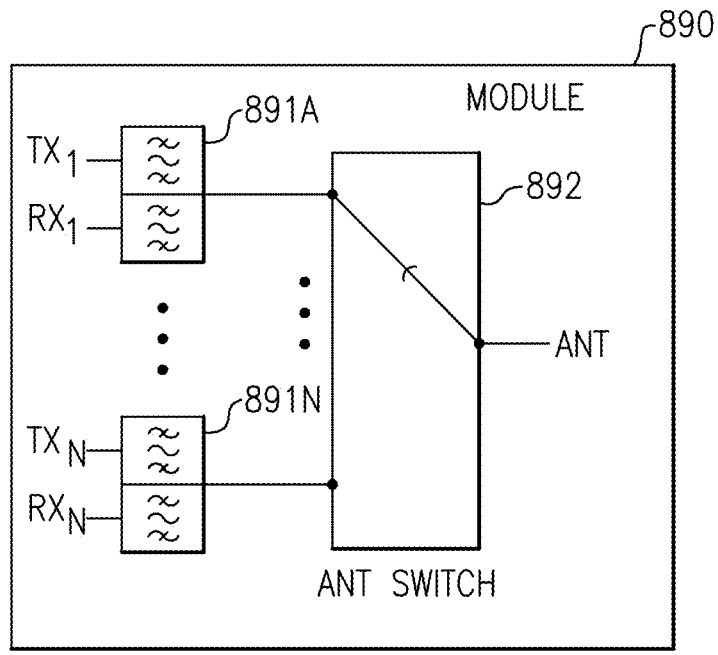
FIG. 23 is a schematic block diagram of a module that includes an antenna switch and duplexers that include an acoustic wave resonator according to an embodiment.

FIG. 23 is a schematic block diagram of a module 890 that includes duplexers 891A to 891N and an antenna switch 892. One or more filters of the duplexers 891A to 891N can include any suitable number of bulk acoustic wave resonators in accordance with any suitable principles and advantages discussed herein. Any suitable number of duplexers 891A to 891N can be implemented. The antenna switch 892 can have a number of throws corresponding to the number of duplexers 891A to 891N. The antenna switch 892 can electrically couple a selected duplexer to an antenna port of the module 890.

Figure 24A:
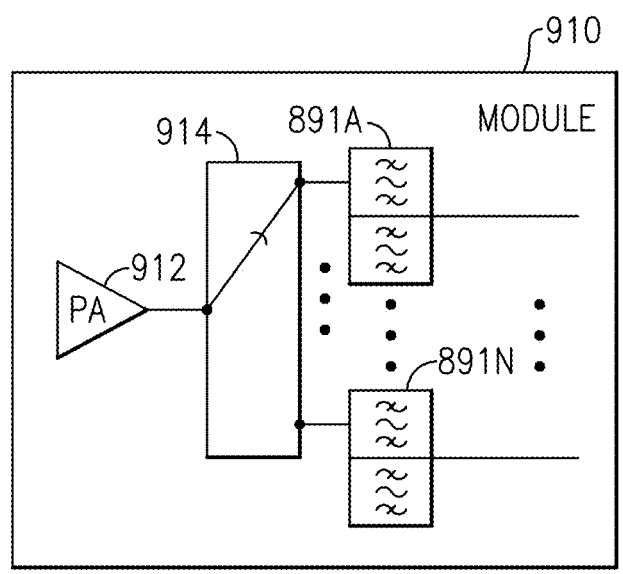
FIG. 24A is a schematic block diagram of a module that includes a power amplifier, a radio frequency switch, and duplexers that include an acoustic wave resonator according to an embodiment.

FIG. 24A is a schematic block diagram of a module 910 that includes a power amplifier 912, a radio frequency switch 914, and duplexers 891A to 891N in accordance with one or more embodiments. The power amplifier 912 can amplify a radio frequency signal. The radio frequency switch 914 can be a multi-throw radio frequency switch. The radio frequency switch 914 can electrically couple an output of the power amplifier 912 to a selected transmit filter of the duplexers 891A to 891N. One or more filters of the duplexers 891A to 891N can include any suitable number of bulk acoustic wave resonators in accordance with any suitable principles and advantages discussed herein. Any suitable number of duplexers 891A to 891N can be implemented.

Figure 24B:
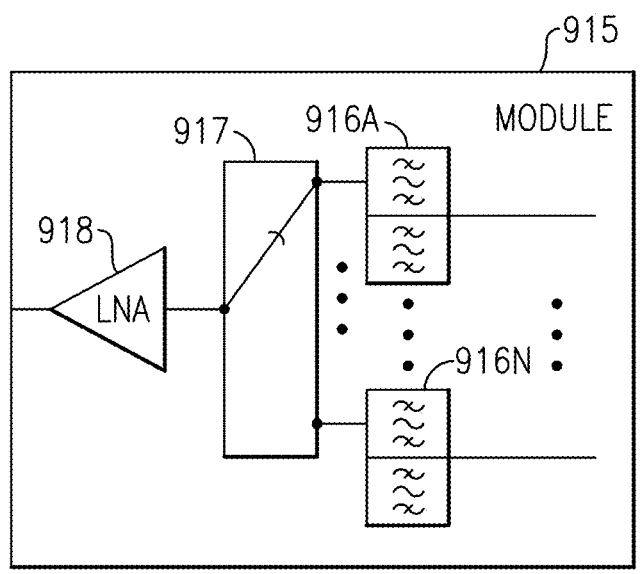
FIG. 24B is a schematic block diagram of a module that includes filters, a radio frequency switch, and a low noise amplifier according to an embodiment.

FIG. 24B is a schematic block diagram of a module 915 that includes filters 916A to 916N, a radio frequency switch 917, and a low noise amplifier 918 according to an embodiment. One or more filters of the filters 916A to 916N can include any suitable number of acoustic wave resonators in accordance with any suitable principles and advantages disclosed herein. Any suitable number of filters 916A to 916N can be implemented. The illustrated filters 916A to 916N are receive filters. In some embodiments (not illustrated), one or more of the filters 916A to 916N can be included in a multiplexer that also includes a transmit filter. The radio frequency switch 917 can be a multi-throw radio frequency switch. The radio frequency switch 917 can electrically couple an output of a selected filter of filters 916A to 916N to the low noise amplifier 918. In some embodiments (not illustrated), a plurality of low noise amplifiers can be implemented. The module 915 can include diversity receive features in certain applications.

Figure 25A:
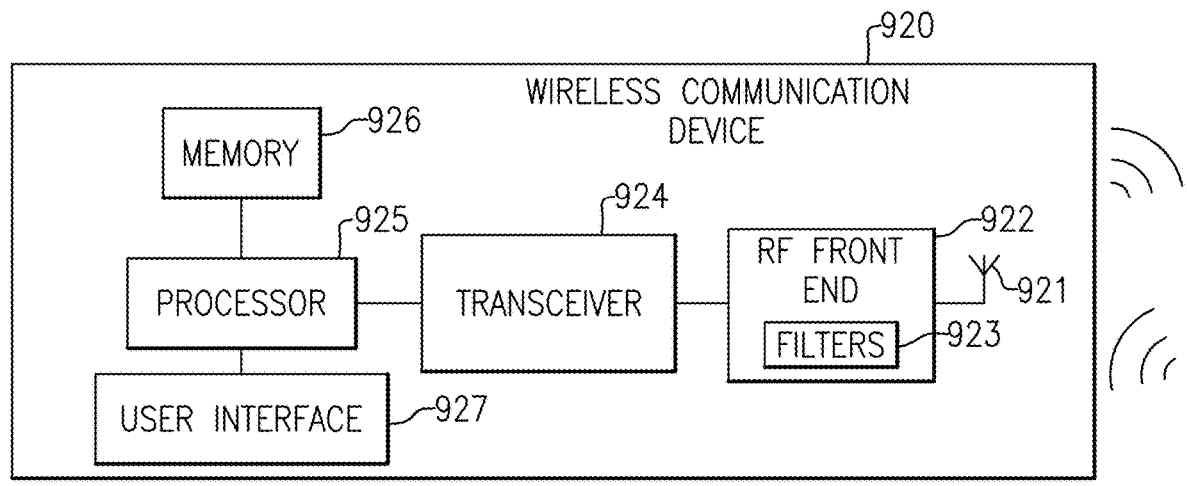
FIG. 25A is a schematic block diagram of a wireless communication device that includes a filter with an acoustic wave resonator in accordance with one or more embodiments.

FIG. 25A is a schematic diagram of a wireless communication device 920 that includes filters 923 in a radio frequency front end 922 according to an embodiment. The filters 923 can include one or more BAW resonators in accordance with any suitable principles and advantages discussed herein. The wireless communication device 920 can be any suitable wireless communication device. For instance, a wireless communication device 920 can be a mobile phone, such as a smart phone. As illustrated, the wireless communication device 920 includes an antenna 921, an RF front end 922, a transceiver 924, a processor 925, a memory 926, and a user interface 927. The antenna 921 can transmit/receive RF signals provided by the RF front end 922. Such RF signals can include carrier aggregation signals. Although not illustrated, the wireless communication device 920 can include a microphone and a speaker in certain applications.

The RF front end 922 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 922 can transmit and receive RF signals associated with any suitable communication standards. The filters 923 can include BAW resonators of a BAW component that includes any suitable combination of features discussed with reference to any embodiments discussed above.

The transceiver 924 can provide RF signals to the RF front end 922 for amplification and/or other processing. The transceiver 924 can also process an RF signal provided by a low noise amplifier of the RF front end 922. The transceiver 924 is in communication with the processor 925. The processor 925 can be a baseband processor. The processor 925 can provide any suitable base band processing functions for the wireless communication device 920. The memory 926 can be accessed by the processor 925. The memory 926 can store any suitable data for the wireless communication device 920. The user interface 927 can be any suitable user interface, such as a display with touch screen capabilities.

Figure 25B:
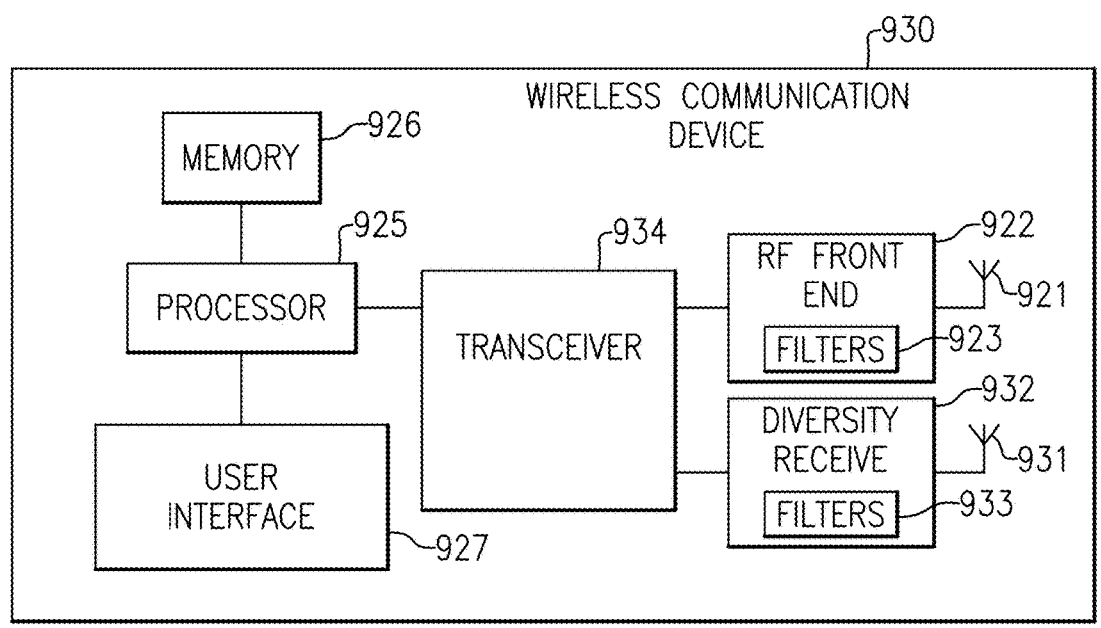
FIG. 25B is a schematic block diagram of another wireless communication device that includes a filter with an acoustic wave resonator in accordance with one or more embodiments.

FIG. 25B is a schematic diagram of a wireless communication device 930 that includes filters 923 in a radio frequency front end 922 and a second filter 933 in a diversity receive module 932. The wireless communication device 930 is like the wireless communication device 900 of FIG. 25A, except that the wireless communication device 930 also includes diversity receive features. As illustrated in FIG. 25B, the wireless communication device 930 includes a diversity antenna 931, a diversity module 932 configured to process signals received by the diversity antenna 931 and including filters 933, and a transceiver 934 in communication with both the radio frequency front end 922 and the diversity receive module 932. The filters 933 can include one or more BAW resonators that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave component comprising:
   a device substrate;
   a metal layer disposed over the device substrate;
   a bulk acoustic wave device separate from the metal layer and disposed over at least a portion of the metal layer so that at least a portion of the metal layer is interposed between the device substrate and the bulk acoustic wave device; and
   one or more vias extending through the device substrate and disposed directly under the metal layer,
   wherein at least a portion of the metal layer is an inductor.

2. The packaged acoustic wave component of claim 1 wherein a cap substrate is spaced above the device substrate and a peripheral wall is attached to and extends between the device substrate and the cap substrate, the peripheral wall surrounding the bulk acoustic wave device.

3. The packaged acoustic wave component of claim 1 wherein the metal layer is planar.

4. The packaged acoustic wave component of claim 1 wherein the metal layer includes spaced apart metal layer portions.

5. The packaged acoustic wave component of claim 4 wherein a filled sacrificial layer is interposed between the metal layer portions.

6. The packaged acoustic wave component of claim 4 wherein a filled piezoelectric layer is interposed between the metal layer portions.

7. The packaged acoustic wave component of claim 1 wherein the metal layer includes an offset portion that defines a recessed cavity.

8. The packaged acoustic wave component of claim 7, wherein the device substrate includes a recessed portion that receives the offset portion of the metal layer.

9. A radio frequency module comprising:
   a package substrate;
   a packaged acoustic wave component including a device substrate, a metal layer disposed over the device substrate, a bulk acoustic wave device separate from the metal layer and disposed over at least a portion of the metal layer so that at least a portion of the metal layer is interposed between the device substrate and the bulk acoustic wave device, and one or more vias extending through the device substrate and disposed directly under the metal layer; and
   additional circuitry chosen from the group consisting of one or more power amplifiers, one or more radio frequency switches, one or more filters and one or more antennas, the packaged acoustic wave component and additional circuitry disposed on the package substrate.

10. The radio frequency module of claim 9 wherein a cap substrate is spaced above the device substrate and a peripheral wall is attached to and extends between the device substrate and the cap substrate, the peripheral wall surrounding the bulk acoustic wave device.

11. The radio frequency module of claim 9 wherein the metal layer is planar.

12. The radio frequency module of claim 9 wherein the metal layer includes spaced apart metal layer portions.

13. The radio frequency module of claim 9 wherein the metal layer includes an offset portion that defines a recessed cavity.

14. A wireless communication device comprising:
an antenna; and
a front end module including one or more packaged acoustic wave components configured to filter a radio frequency signal associated with the antenna, each packaged acoustic wave component including a device substrate, a metal layer disposed over the device substrate, a bulk acoustic wave device separate from the metal layer and disposed over at least a portion of the metal layer so that at least a portion of the metal layer is interposed between the device substrate and the bulk acoustic wave device, and one or more vias extending through the device substrate and disposed directly under the metal layer.

15. The wireless communication device of claim 14 wherein a cap substrate is spaced above the device substrate and a peripheral wall is attached to and extends between the device substrate and the cap substrate, the peripheral wall surrounding the bulk acoustic wave device.

* * * * *